US008710762B2

(12) United States Patent
Takahashi et al.

(10) Patent No.: US 8,710,762 B2
(45) Date of Patent: Apr. 29, 2014

(54) DC/DC CONVERTER, POWER SUPPLY CIRCUIT, AND SEMICONDUCTOR DEVICE

(75) Inventors: Kei Takahashi, Kanagawa (JP); Jun Koyama, Kanagawa (JP); Masato Ishii, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 335 days.

(21) Appl. No.: 13/154,827

(22) Filed: Jun. 7, 2011

(65) Prior Publication Data

US 2011/0304311 A1      Dec. 15, 2011

(30) Foreign Application Priority Data

Jun. 10, 2010   (JP) ................................. 2010-132529

(51) Int. Cl.
*H02M 1/36*        (2007.01)
(52) U.S. Cl.
USPC ........................................... 315/291; 363/89
(58) Field of Classification Search
USPC ................ 327/309, 313, 318, 328, 423, 534;
323/222, 237, 265, 282, 311–316;
257/51, 57, 69, 194, 296, E21.403;
315/151, 159, 291, 307; 363/89, 127
See application file for complete search history.

(56) References Cited

U.S. PATENT DOCUMENTS

| 5,365,083 | A |   | 11/1994 | Tada |
|---|---|---|---|---|
| 5,694,030 | A | * | 12/1997 | Sato et al. .................... 323/282 |
| 5,731,856 | A |   | 3/1998 | Kim et al. |
| 5,744,864 | A |   | 4/1998 | Cillessen et al. |
| 5,946,207 | A | * | 8/1999 | Schoofs ........................ 363/127 |
| 6,294,274 | B1 |   | 9/2001 | Kawazoe et al. |
| 6,326,772 | B2 | * | 12/2001 | Kusumoto et al. ............. 320/166 |
| 6,433,609 | B1 | * | 8/2002 | Voldman ....................... 327/313 |
| 6,563,174 | B2 |   | 5/2003 | Kawasaki et al. |
| 6,727,522 | B1 |   | 4/2004 | Kawasaki et al. |

(Continued)

FOREIGN PATENT DOCUMENTS

| CN | 101171678 A | 4/2008 |
|---|---|---|
| EP | 0 488 677 A2 | 6/1992 |

(Continued)

OTHER PUBLICATIONS

International Search Report, PCT Application No. PCT/JP2011/061464, dated Aug. 23, 2011, 2 pages.

(Continued)

*Primary Examiner* — Rajnikant Patel
(74) *Attorney, Agent, or Firm* — Fish & Richardson P.C.

(57) ABSTRACT

Provided is a DC-DC converter with improved power conversion efficiency. A transistor which is incorporated in the DC-DC converter and functions as a switching element for controlling output power includes, in its channel formation region, a semiconductor material having a wide band gap and significantly small off current compared with silicon. The transistor further comprises a back gate electrode, in addition to a general gate electrode, and a back gate control circuit for controlling a potential applied to the back gate electrode in accordance with the output power from the DC-DC converter. The control of the potential applied to the back gate electrode by the back gate control circuit enables the threshold voltage to decrease the on-state resistance when the output power is high and to increase the off-state current when the output power is low.

22 Claims, 21 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,727 B2 * | 4/2007 | Takeshita et al. ............ 315/291 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 * | 7/2008 | Levy et al. .................... 438/584 |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,805 B2 * | 3/2009 | Nishida ........................ 323/222 |
| 7,557,459 B2 * | 7/2009 | Yamashita et al. ............ 307/9.1 |
| 7,601,984 B2 | 10/2009 | Sano et al. |
| 7,674,650 B2 | 3/2010 | Akimoto et al. |
| 7,679,942 B2 * | 3/2010 | Nishida ........................ 363/62 |
| 7,732,819 B2 | 6/2010 | Akimoto et al. |
| 7,737,773 B2 * | 6/2010 | Kanamori et al. ............ 327/589 |
| 7,910,490 B2 | 3/2011 | Akimoto et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085515 A1 | 4/2007 | Nishida |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0128219 A1 | 5/2009 | Umemoto |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0320458 A1 | 12/2010 | Umeda et al. |
| 2010/0320459 A1 | 12/2010 | Umeda et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-199682 A | 7/1992 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-110833 A | 4/2007 |
| JP | 2007-123861 A | 5/2007 |
| JP | 2009-231613 A | 10/2009 |
| JP | 2009-253990 A | 10/2009 |
| JP | 2010-016347 A | 1/2010 |
| JP | 4415062 A | 2/2010 |
| JP | 2010-067954 A | 3/2010 |
| JP | 2010-177431 A | 8/2010 |
| JP | 4571221 A | 10/2010 |
| JP | 2011-009504 A | 1/2011 |

(56) References Cited

FOREIGN PATENT DOCUMENTS

| | | |
|---|---|---|
| JP | 2012-160679 A | 8/2012 |
| WO | 2004/114391 A1 | 12/2004 |
| WO | 2006/135062 A1 | 12/2006 |
| WO | 2008/133345 A1 | 11/2008 |
| WO | 2010/150427 A1 | 12/2010 |

OTHER PUBLICATIONS

Written Opinion, PCT Application No. PCT/JP2011/061464, dated Aug. 23, 2011, 5 pages.
Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, p. 21-008 (with full English translation).
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and SN-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9:Numerical Analysis on Temperature Dependence of Characteristics of Amorphous 'In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-0 Tfts," SID Digest '08 : SID International Symposium Digest of Technical Papers, May 20, 2008, vol. 39, pp. 621-624.
Hirao, T et al.. "Novel Top-Gate Zinc Oxide Thin-Film Transistors (ZNO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda.. T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5) Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases,", Nature Materials, Sep. 1, 2002, vol. 1, pp. 64-68.
Kim, S et al., "High-Performance oxide thin film transistors passivated by various gas plasmas," the Electrochemical Society, 214TH ECS Meeting, 2008, No. 2317, 1 page.
Kimizuka, n. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] At Temperatures Over 1000°C," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13TH International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," Digest '07 : SID International Symposium Digest of Technical Papers, 2007, vol. 38, pp. 1673-'1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar., 1995, vol. 150, pp. 1-4 with English translation.
Nakamura, M et al., "The phase relations in the $In_2O_3$-$Ga_2ZnO_4$-ZnO system at 1350°C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.
Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide $InGaO_3(ZnO)_m$ (m<4):a Zn4s conductor," Philosophical Magazine, 2001, vol. 81, No. 5, pp. 501-515.
Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.
Osada, T et al., "Development of Driver-Integrated Panel Using Amorphous In-Ga-Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium-Gallium-Zinc Oxide TFTS and Their Application for Large Size AMOLED." AM-FPD '08 Digest of Technical Papers, Jul. 2, 2008, pp. 275-278.
Park, S et al., "Challenge to Future Displays: Transparent AM-OLED Driven by Peald Grown ZNO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-IN. AMOLED Display With Driver Circuit Using Amorphous In-Ga-Zn-Oxide TFTS," Idw '09 : Proceedings of the 16TH International Display Workshops, 2009, pp. 689-692.
Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

DC/DC CONVERTER, POWER SUPPLY CIRCUIT, AND SEMICONDUCTOR DEVICE

TECHNICAL FIELD

The present invention relates to a DC-DC converter (direct current-direct current converter), a power supply circuit, and a semiconductor device, which include thin semiconductor films.

BACKGROUND ART

In recent years, a metal oxide having semiconductor characteristics, which is called an oxide semiconductor, has attracted attention as a novel semiconductor material having high mobility as polysilicon or microcrystalline silicon and having uniform element characteristics as amorphous silicon. A metal oxide is used for various applications. For example, indium oxide which is a well-known metal oxide is used as a material of a transparent electrode included in a liquid crystal display device or the like. Examples of such metal oxides having semiconductor characteristics include tungsten oxide, tin oxide, indium oxide, and zinc oxide. Transistors each of which includes a channel formation region formed using such a metal oxide having semiconductor characteristics have been known (Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

A DC-DC converter is a constant-voltage circuit with which a constant output voltage can be obtained regardless of the value of an input voltage, and the DC-DC converter is used for a power supply circuit together with a rectification circuit or the like. In particular, a power supply circuit including a switching type DC-DC converter is referred to as a switching power source or a switching regulator.

The switching type DC-DC converter outputs a voltage of a predetermined level in such a manner that voltage with a pulse waveform is formed using an input voltage by a switching element and the voltage is smoothed or held in a coil, a capacitor, or the like. With a switching type DC-DC converter, internal power loss can be lower theorically, whereby power conversion efficiency can be high and heat radiation due to power loss can be suppressed in comparison with a linear type DC-DC converter utilizing voltage drop due to resistance. Therefore, in a semiconductor device which needs a high output voltage, such as a microprocessor, a power supply circuit including the switching type DC-DC converter is often used.

However, although the switching type DC-DC converter has high power conversion efficiency in comparison with the linear type one, it is necessary to further increase power conversion efficiency in order to achieve reduction in power consumption of a semiconductor device. In particular, in the case of a portable electronic device using power accumulated in a capacitor or a battery such as a primary battery or a secondly battery, the DC-DC converter is necessarily used for converting voltage output from the battery, the capacitor, or the like into a voltage of an optimal level. Improvement of power conversion efficiency of the DC-DC converter leads to lower power consumption of a semiconductor device and a long continuous use time of a portable electronic device including the semiconductor device.

In view of the above problems, an object of the present invention is to provide a DC-DC converter achieving improvement of power conversion efficiency and a power supply circuit including the DC-DC converter. Further, an object of the present invention is to reduce power consumption of a semiconductor device including a DC-DC converter.

The present inventors focus on the fact that the power conversion efficiency of the DC-DC converter depends on the on-state resistance or the off-state current of a transistor functioning as a switching element for controlling output power. Further, the present inventors consider that in the case where the output power of the DC-DC converter is low, power loss due to the off-state current of a transistor, rather than power loss due to the on-state resistance of the transistor, leads to lower power conversion efficiency. Moreover, the present inventors also consider that in the case of the output power of the DC-DC converter is high, the power loss due to the on-state resistance of the transistor, rather than power loss due to the off-state current of a transistor, leads to lower power conversion efficiency.

In a DC-DC converter according to an embodiment of the present invention, a transistor functioning as a switching element includes a back gate electrode, which controls the threshold voltage and which faces a general gate electrode, in addition to the general gate electrode. Further, the DC-DC converter includes a back gate control circuit for controlling a potential applied to the back gate electrode in accordance with the output power output from the DC-DC converter. The potential applied to the back gate electrode is controlled by the back gate control circuit, so that the threshold voltage can be adjusted to lower the on-state resistance when the output power is high (i.e., when the output power exceeds a predetermined value) and to lower the off-state current when the output power is low (i.e., when the output power is equal or smaller than the predetermined value).

Further, in a DC-DC converter according to an embodiment of the present invention, a transistor functioning as a switching element is an insulating-gate-field-effect transistor with an extremely low off-state current (hereinafter, simply referred to as a transistor). A channel formation region of the transistor includes a semiconductor material whose band gap is wider than that of a silicon semiconductor and whose intrinsic carrier density is lower than that of silicon. The semiconductor material having such characteristics is included in the channel formation region, so that a transistor with an extremely low off-state current and high withstand voltage can be realized. As examples of such a semiconductor material, an oxide semiconductor having a band gap which is approximately three times as large as that of silicon can be given. The transistor with such a structure is used as a switching element, so that deterioration of the switching element due to application of high voltage can be prevented in the case of high output power, and an off-state current can be suppressed to be extremely low in the case of low output power.

An oxide semiconductor highly-purified by reduction in impurities such as moisture or hydrogen which serves as an electron donor (a purified OS) is an i-type semiconductor (an intrinsic semiconductor) or a substantially i-type semiconductor. Therefore, a transistor including the oxide semiconductor has a characteristic of very low off-state current. Specifically, the hydrogen concentration in the highly-purified oxide semiconductor which is measured by secondary ion mass spectrometry (SIMS) is less than or equal to $5 \times 10^{19}/cm^3$, preferably less than or equal to $5 \times 10^{18}/cm^3$, more preferably less than or equal to $5\times10^{17}/cm^3$, still more preferably less than or equal to $1\times10^{16}/cm^3$. In addition, the carrier density of the oxide semiconductor film, which is measured by Hall effect measurement, is less than $1\times10^{14}/cm^3$, preferably less than $1\times10^{12}/cm^3$, more preferably less than $1\times10^{11}/cm^3$. Furthermore, the band gap of the oxide semiconductor is 2 eV or more, preferably 2.5 eV or more, more preferably 3 eV or more. With the use of the oxide semiconductor film which is highly purified by sufficiently reducing the concentration of impurities such as moisture or hydrogen, an off-state current of the transistor can be reduced.

The analysis of the concentration of hydrogen in the oxide semiconductor film is described here. The hydrogen concentrations in the oxide semiconductor film and the conductive film are measured by SIMS. It is known that it is difficult to obtain data in the proximity of a surface of a sample or in the proximity of an interface between stacked films formed using different materials by the SIMS because of its principle. Thus, in the case where distributions of the hydrogen concentration of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a maximum peak and a minimum valley do not exist in the region where the film is provided, the value of the inflection point is employed as the hydrogen concentration.

Various experiments can actually prove a low off-state current of the transistor including the highly-purified oxide semiconductor film as an active layer. For example, even with an element with a channel width of $1\times10^6$ μm and a channel length of 10 μm, in a range of from 1 V to 10 V of voltage (drain voltage) between a source electrode and a drain electrode, it is possible that an off-state current (which is drain current in the case where voltage between a gate electrode and the source electrode is 0 V or lower) is less than or equal to the measurement limit of a semiconductor parameter analyzer, that is, less than or equal to $1\times10^{-13}$ A. In this case, an off-state current density corresponding to a value obtained by dividing the off-state current by the channel width of the transistor is less than or equal to 100 zA/μm. As mentioned below, a capacitor and a transistor were connected to each other and an off-state current density was measured by using a circuit in which electric charge flowing to or out from the capacitor was controlled by the transistor. In the measurement, the highly-purified oxide semiconductor film was used as a channel formation region in the transistor, and the off-state current density of the transistor was measured on the basis of change in the amount of electric charge of the capacitor per unit time. As a result, in the case where the voltage between the source electrode and the drain electrode of the transistor was 3V, a lower off-state current density of several tens yoctoampere per micrometer (yA/μm) was obtained. Therefore, in the semiconductor device relating to an embodiment of the present invention, the off-state current density of the transistor including the highly-purified oxide semiconductor film as an active layer can be less than or equal to 100 yA/μm, preferably less than or equal to 10 yA/μm, or more preferably less than or equal to 1 yA/μm, depending on the voltage between the source electrode and drain electrode.

Accordingly, a transistor including the highly purified oxide semiconductor film as an active layer has extremely low off-state current density compared with that of a transistor including crystalline silicon.

As the oxide semiconductor, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor; an In—O-based oxide semiconductor; a Sn—O-based oxide semiconductor; or a Zn—O-based oxide semiconductor can be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric proportion. The above oxide semiconductor may include silicon.

Alternatively, the oxide semiconductor can be represented by the chemical formula, $InMO_3(ZnO)_m$, (m>0, m is not necessarily a natural number). Here, M represents one or more metal elements selected from Zn, Ga, Al, Mn, and Co. For example, M can be Ga, Ga and Al, Ga and Mn, Ga and Co, or the like.

In an embodiment of the present invention, with the aforementioned structure, the on-state resistance of a transistor is lowered in the case of high output power and the off-state current of the transistor is lowered in the case of low output power. Accordingly, anticipation of a countermeasure against the power loss taking into account the fact that a main factor of power loss depends on the magnitude of the output power allows the improvement in the power conversion efficiency of a DC-DC converter and a power supply circuit including the DC-DC converter. In addition, the power conversion efficiency of the DC-DC converter can be improved, so that power consumption of a semiconductor device including the DC-DC converter can be reduced.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that the present invention includes, in its category, all the semiconductor devices in which a DC-DC converter or a power supply circuit can be used: for example, integrated circuits such as microprocessors and image processing circuits, RF tags, memory media, solar cells, lighting devices including light-emitting elements, and semiconductor display devices. Further, the semiconductor display devices include semiconductor display devices including the DC-DC converter and the power supply circuit, such as liquid crystal display devices, lighting devices in which a light-emitting element typified by an organic light-emitting element (OLED) is provided for each pixel, electronic paper, digital micromirror devices (DMD), plasma display panels (PDP), field emission displays (FED), and the like, in its category.

Embodiment 1

Figure 1A:
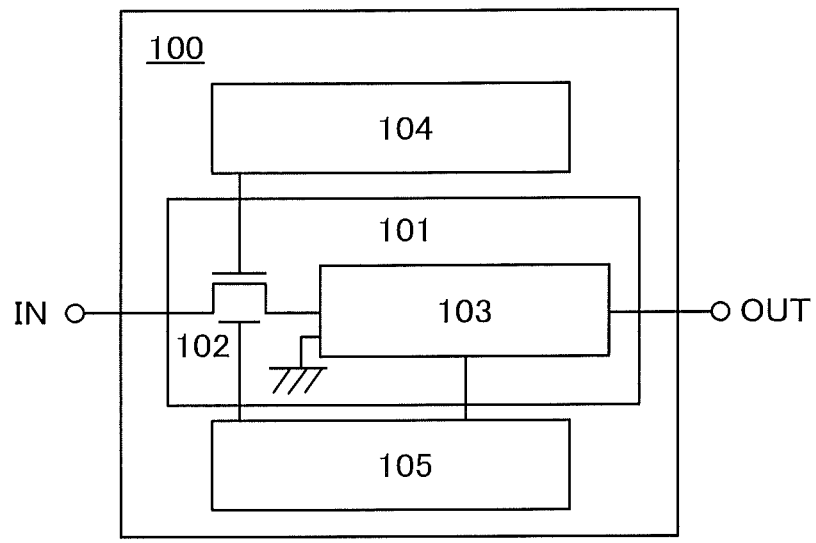
FIG. 1A is a diagram illustrating a structure of a DC-DC converter and FIG. 1B is a diagram illustrating a cross-sectional structure of a transistor.

FIG. 1A illustrates an example of a structure of a DC-DC converter according to an embodiment of the present invention.

A DC-DC converter 100 illustrated in FIG. 1A includes a power conversion circuit 101 which generates a constant voltage (output voltage) by the use of voltage applied to an input terminal IN (input voltage) and outputs the constant voltage from an output terminal OUT. The power conversion circuit 101 includes a constant-voltage generation portion 103 and a transistor 102 functioning as a switching element.

When the transistor 102 is on, the input voltage is supplied to the constant-voltage generation portion 103. When the transistor 102 is off, the input voltage is not supplied to the constant-voltage generation portion 103. When the transistor 102 is turned off, a fixed voltage such as a ground potential is supplied to the constant-voltage generation portion 103. Therefore, in response to switching of the transistor 102, a pulsed signal in which the input voltage and a fixed voltage are alternated is supplied to the constant-voltage generation portion 103.

The constant-voltage generation portion 103 includes any one or more of a coil, a capacitor, and a diode. The constant-voltage generation portion 103 generates a constant-output voltage by smoothing or holding the voltage of the signal when a pulsed signal is supplied.

Further, the DC-DC converter 100 illustrated in FIG. 1A includes an output voltage control circuit 104 for controlling the ratio of on time to off time of the transistor 102. The output voltage control circuit 104 controls the ratio of on time to off time of the transistor 102, so that a percentage of periods in which pulses are generated, that is, a duty ratio, in a pulsed signal supplied to the constant-voltage generation portion 103 can be controlled.

Switching of the transistor 102 can be controlled by a voltage Vgs between a gate electrode and a source electrode of the transistor 102. The output voltage control circuit 104 controls a variation in the voltage Vgs over time to control the ratio of on time to off time of the transistor 102.

When the duty ratio varies, the output voltage varies. Specifically, the increase in percentage of periods in which pulses of the input voltage are generated results in the increase in difference between the output voltage and a fixed voltage. In contrast, the decreases in percentage of periods in which pulses of the input voltage are generated leads to the decrease in difference between the output voltage and a fixed voltage.

Note that in an embodiment of the present invention, the transistor 102 includes a back gate electrode for controlling the threshold voltage of the transistor 102 in addition to a general gate electrode. Specifically, the transistor 102 includes a semiconductor film functioning as an active layer, the gate electrode, and the back gate electrode overlapping with the gate electrode with the semiconductor film therebetween. Further, the transistor 102 includes an insulating film formed between the gate electrode and the semiconductor film, an insulating film formed between the back gate electrode and the semiconductor film, and a source electrode and a drain electrode which are in contact with the semiconductor film.

In addition, the DC-DC converter illustrated in FIG. 1A includes a back gate control circuit 105 for controlling the potential applied to the back gate electrode of the transistor 102. The threshold voltage of the transistor 102 can be controlled by adjusting the back gate voltage Vbgs between the back gate electrode and the source electrode. Further, the back gate control circuit 105 adjusts the back gate voltage Vbgs by controlling the potential applied to the back gate electrode in accordance with power (output power) output from the DC-DC converter 100, thereby controlling the threshold voltage of the transistor 102 in accordance with the output power.

Specifically, in the case of high output power (i.e., when the output power of the DC-DC converter exceeds over the predetermined value), the back gate control circuit 105 makes the back gate voltage Vbgs high to shift the threshold voltage in a negative direction to reduce the on-state resistance of the transistor 102. On the other hand, in the case of low output power (i.e., when the output power of the DC-DC converter is equal to or smaller than a predetermined value), the back gate control circuit 105 makes the back gate voltage Vbgs low to shift the threshold voltage in a positive direction to reduce the on-state resistance of the transistor 102.

With the above structure, in the case of low output power of the DC-DC converter 100, the power loss due to the off-state current of the transistor 102 is preferentially suppressed to be low over the reduction in power loss due to the on-state resistance of the transistor 102, whereby reduction in power conversion efficiency can be prevented. On the other hand, in the case of high output power of the DC-DC converter 100, the power loss due to the on-state resistance of the transistor 102 is preferentially suppressed to be low over the power loss due to the off-state current of the transistor 102, whereby reduction in power conversion efficiency can be prevented.

Unless otherwise specified, in this specification, the off-state current of an n-channel transistor is current which flows between a source electrode and a drain electrode when the potential of the gate electrode is less than or equal to zero, in the case where a potential of the drain electrode is higher than that of the source electrode and that of a gate electrode, and a reference potential is the potential of the source electrode. Alternatively, in this specification, the off-state current of a p-channel transistor is current which flows between a source electrode and a drain electrode when the potential of the gate electrode is greater than or equal to zero in the case where a potential of the drain electrode is lower than that of the source electrode or that of a gate electrode, and a reference potential is the potential of the source electrode.

In the DC-DC converter 100 according to an embodiment of the present invention, the semiconductor film of the transistor 102 includes a wide gap semiconductor material with a wider band gap than that of a silicon semiconductor and a lower intrinsic carrier density than that of silicon. Note that as examples of a wide-gap semiconductor, a compound semiconductor such as silicon carbide (SiC) or gallium nitride (GaN), an oxide semiconductor including a metal oxide such as zinc oxide (ZnO), and the like can be given. However, compound semiconductors such as silicon carbide and gallium nitride are required to be single crystal, and it is difficult to meet the fabricating condition to obtain a single crystal material; for example, crystal growth at a temperature extremely higher than a process temperature of the oxide semiconductor is needed or epitaxial growth over a special substrate is needed. In addition, it is difficult to form such compound semiconductors over a silicon wafer or a glass substrate with low heat resistance, which can be obtained easily. On the other hand, the oxide semiconductor is advantageous in that it can be formed by a sputtering method or a wet method (such as a printing method) and has high mass productivity. Thus, an oxide semiconductor film can be formed at a room temperature; accordingly, the oxide semiconductor film can be formed over a glass substrate or over an integrated circuit including a semiconductor element, and moreover, such a substrate can be large. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be obtained by heat treatment at 200° C. to 800° C.

In the following description, the case where an oxide semiconductor having the above advantages is used as the semiconductor having a wide band gap is given as an example.

With a channel formation region including a semiconductor material having the above characteristics, the transistor 102 with an extremely low off-state current and high withstand voltage can be realized. Further, the transistor 102 with the above-mentioned structure is used as a switching element, deterioration of the switching element due to application of high voltage can be prevented in the case of high output power, and an off-state current can be suppressed to be extremely low in the case of low output power.

Figure 1B:
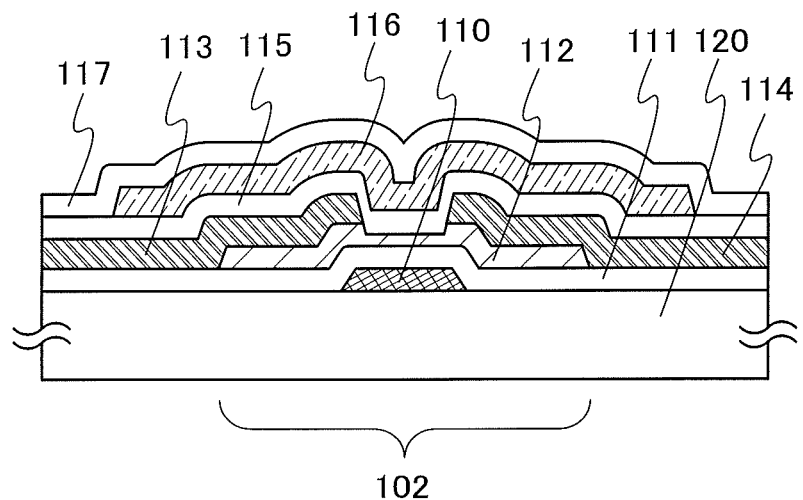

A cross-sectional view of FIG. 1B illustrates an example of a structure of the transistor 102 which is a top-gate transistor and has a channel-etched structure.

The transistor 102 illustrated in FIG. 1B includes, over a substrate 120 having an insulating surface, a gate electrode 110, an insulating film 111 which is formed over the gate electrode 110, a semiconductor film 112 which overlaps with the gate electrode 110 with the insulating film 111 therebetween, a source electrode 113 and a drain electrode 114 which are formed over the semiconductor film 112, an insulating film 115 which is formed over the semiconductor film 112, the source electrode 113, and the drain electrode 114, and a back gate electrode 116 which is formed so as to overlap with the semiconductor film 112 with the insulating film 115 therebetween. Moreover, the back gate electrode 116 may be covered with an insulating film 117 and the transistor 102 may be regarded as including the insulating film 117 as its component.

As an example, the transistor 102 in FIG. 1B illustrates the case where the transistor 102 is a bottom-gate transistor and has a channel-etched structure. Part of the semiconductor film 112 which is between the source electrode 113 and the drain electrode 114, that is, part of the semiconductor film 112 with which neither the source electrode 113 nor the drain electrode 114 overlaps, is etched.

Although FIG. 1B illustrates an example of the case where the transistor 102 is a single-gate structure, the transistor 102 may be a multi-gate transistor in which a plurality of gate electrodes 110 electrically connected to each other are included so that a plurality of channel formation regions are included.

By using an oxygen-containing inorganic material such as silicon oxide and silicon oxynitride for the insulating film 115 which is in contact with the semiconductor film 112, even if oxygen deficiency in the semiconductor film 112 is generated due to heat treatment for reduction in moisture and hydrogen, oxygen can be supplied from the insulating film 115 to the semiconductor film 112, thereby reducing the oxygen deficiency as a donor to satisfy the stoichiometric composition of the semiconductor material. It is preferred that the semiconductor film 112 contains oxygen whose composition exceeds the stoichiometric one. As a result, the semiconductor film 112 can be made to be substantially i-type and a variation in electric characteristics of the transistor 102 due to oxygen deficiency can be reduced, which results in improvement of the electric characteristics.

Alternatively, heat treatment may be performed on the semiconductor film 112 in an oxygen atmosphere to add oxygen to the oxide semiconductor so that the oxygen deficiency that serves as a donor in the semiconductor film 112 is reduced. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more preferably greater than or equal to 7N (99.99999%)

(that is, the impurity concentration in the oxygen is less than or equal to 1 ppm, or preferably less than or equal to 0.1 ppm).

Alternatively, an ion implantation method, an ion doping method, or the like may be employed to add oxygen to the semiconductor film 112 so that oxygen deficiency as a donor is reduced. For example, oxygen made to be plasma with a microwave of 2.45 GHz may be added to the semiconductor film 112.

Note that, in this specification, an oxynitride compound contains a higher amount of oxygen than that of nitrogen, and a nitride oxide compound contains a higher amount of nitrogen than that of oxygen.

Next, an example of a specific structure of the power conversion circuit 101 will be described.

Note that the term "connection" in this specification refers to electrical connection: the state in which current, a potential, or voltage can be supplied or transmitted. Accordingly, connection means not only direct connection but also indirect connection through a circuit element such as a wiring, a resistor, a diode, or a transistor so that current, a potential, or voltage can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

The names of the "source electrode" and the "drain electrode" included in the transistor interchange with each other depending on the polarity of the transistor or difference between the potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. Hereinafter, one of a source electrode and a drain electrode is a first terminal and the other is a second terminal. A structure of the DC-DC converter will be described below.

Figure 2A:
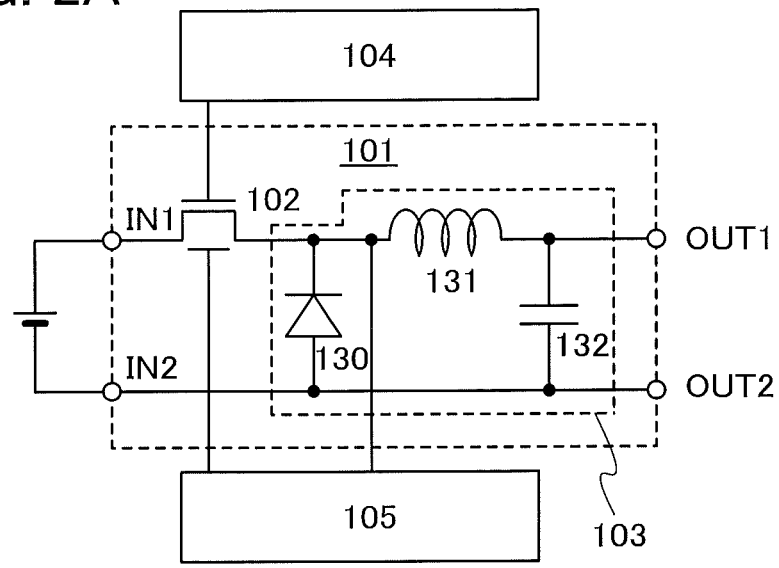
FIGS. 2A and 2B are diagrams each illustrating an example of a structure of a DC-DC converter.

The DC-DC converter according to an embodiment of the present invention may be a step-up DC-DC converter which outputs the output voltage higher than an input voltage or a step-down DC-DC converter which outputs the output voltage lower than the input voltage. FIG. 2A illustrates a structure of a step-down DC-DC converter.

In the DC-DC converter illustrated in FIG. 2A, the constant-voltage generation portion 103 includes a diode 130, a coil 131, and a capacitor 132. Further, the DC-DC converter in FIG. 2A includes an input terminal IN1 supplied with the input voltage, an input terminal IN2 supplied with a fixed voltage, an output terminal OUT1, and an output terminal OUT2.

The transistor 102 controls connection between the input terminal IN1 and a cathode of the diode 130. Specifically, a first terminal of the transistor 102 is connected to the input terminal IN1 and a second terminal of the transistor 102 is connected to the cathode of the diode 130. One of terminals of the coil 131 is connected to the cathode of the diode 130 and the other of the terminals of the coil 131 is connected to the output terminal OUT1 of the DC-DC converter. The input terminal IN2 is connected to an anode of the diode 130 and the output terminal OUT2. One of electrodes of the capacitor 132 is connected to the output terminal OUT1 and the other of the electrodes of the capacitor 132 is connected to the output terminal OUT2.

In the DC-DC converter in FIG. 2A, when the transistor 102 is turned on, a potential difference between the input terminal IN1 and the output terminal OUT1 is generated; thus, current flows through the coil 131. The coil 131 is magnetized by the current flow, and electromotive force in a direction opposite to that of the current flow is generated by self induction. Therefore, voltage which is obtained by decrease in the input voltage supplied to the input terminal IN1 is supplied to the output terminal OUT1. In other words, between the pair of electrodes of the capacitor 132, voltage corresponding to a difference between a fixed voltage supplied from the input terminal IN2 and the voltage obtained by decrease in the input voltage is provided.

When the transistor 102 is turned off, a current path formed between the input terminal IN1 and the output terminal OUT1 is blocked. In the coil 131, the electromotive force in the direction preventing the change of the current, that is, in the direction opposite to that of electromotive force generated when the transistor 102 is on is generated. Therefore, the current that flows to the coil 131 is kept by voltage generated by the electromotive force. In other words, when the transistor 102 is off, a current path is formed between the output terminal OUT1 and the input terminal IN2 or the output terminal OUT2 through the coil 131 and/or the diode 130. Accordingly, voltage applied between the pair of electrodes of the capacitor 132 is held to some extent.

Note that voltage held in the capacitor 132 corresponds to the voltage output from the output terminal OUT1. In the above operation, as a percentage of on time of the transistor 102 is higher, voltage held in the capacitor 132 becomes close to a difference between the fixed voltage and the input voltage. Accordingly, the voltage can be decreased so that the output voltage close to that of the input voltage is obtained. In contrast, as a percentage of off time of the transistor 102 is higher, a difference between the fixed voltage and the voltage held in the capacitor 132 becomes smaller. Accordingly, the voltage can be decreased so that the output voltage close to that of the fixed voltage is obtained.

Figure 2B:
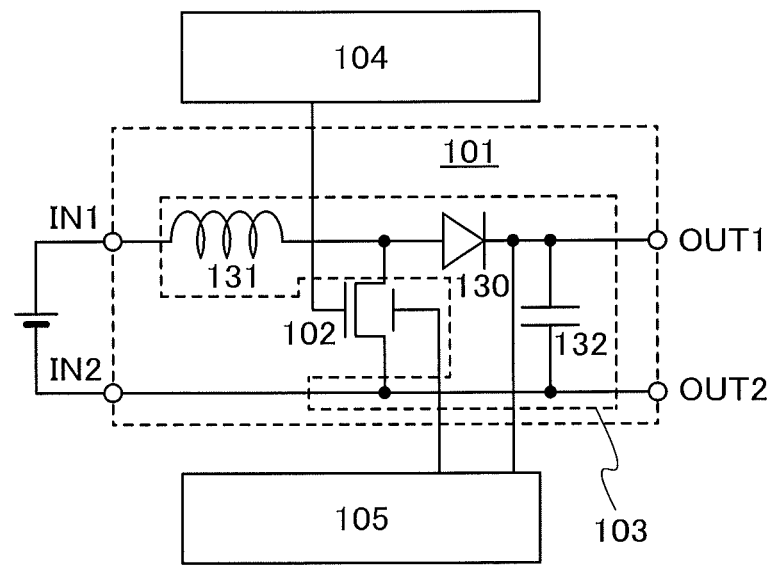

Next, FIG. 2B illustrates a structure of the step-up DC-DC converter.

In the DC-DC converter illustrated in FIG. 2B, the constant-voltage generation portion 103 includes the diode 130, the coil 131, and the capacitor 132. Further, the DC-DC converter in FIG. 2B includes the input terminal IN1 supplied with the input voltage, the input terminal IN2 supplied with a fixed voltage, the output terminal OUT1, and the output terminal OUT2.

The one of the terminals of the coil 131 is connected to the input terminal IN1 and the other of the terminals of the coil 131 is connected to the anode of the diode 130. The transistor 102 controls connection between the input terminal IN2 or the output terminal OUT2 and a node between the coil 131 and the diode 130. Specifically, the first terminal of the transistor 102 is connected to the node between the coil 131 and the diode 130, and the second terminal of the transistor 102 is connected to the input terminal IN2 and the output terminal OUT2. The cathode of the diode 130 is connected to the output terminal OUT1. The one of the pair of electrodes of the capacitor 132 is connected to the output terminal OUT1 and the other of the electrodes of the capacitor 132 is connected to the output terminal OUT2.

In the DC-DC converter illustrated in FIG. 2B, when the transistor 102 is turned on, current flows to the coil 131 because of a potential difference between the input terminal IN1 and the input terminal IN2. The coil 131 is magnetized because the current flows thereto. Note that in the coil 131, electromotive force in an opposite direction to that of the current flow is generated by self induction, so that the current is gradually increased.

Next, when the transistor 102 is turned off, a current path formed between the input terminal IN1 and the input terminal IN2 is blocked. In the coil 131, the electromotive force in the direction preventing the change of the current, that is, in the direction opposite to that of electromotive force generated when the transistor 102 is on is generated. Therefore, voltage corresponding to the current flowing to the coil 131 when the transistor 102 is on is generated between the pair of the terminals of the coil 131. Then, current flowing through the coil 131 is held by voltage generated between the terminals. In other words, when the transistor 102 is off, a current path is formed between the input terminal IN1 and the output terminal OUT1 through the coil 131 and the diode 130. At this time, voltage which is the sum of the input voltage applied to the input terminal IN1 and the voltage generated between the terminals of the coil 131 is supplied to the output terminal OUT1, and the voltage is output from the DC-DC converter. Voltage corresponding to a difference between the voltage of the output terminal OUT1 and the fixed voltage is held between the electrodes of the capacitor 132.

In the above operation, when a percentage of on time of the transistor 102 is high, current flowing through the coil 131 is large. Therefore, voltage between the terminals of the coil 131 is high when the transistor 102 is turned off, which allows the boosting in voltage so that a difference between the output voltage and the input voltage is increased. In contrast, as a percentage of off time of the transistor 102 is higher, current flowing to the coil 131 is small. Therefore, voltage between the terminals of the coil 131 is low when the transistor 102 is turned off, which allows the boosting in voltage so that a difference between the output voltage and the input voltage is reduced.

Note that although FIGS. 1A and 1B and FIGS. 2A and 2B show a structure in which the constant-voltage generation portion 103 includes one transistor 102 functioning as a switching element, the present invention is not limited to this structure. In this embodiment of the present invention, a plurality of transistors may function as one switching element. In the case where the plurality of transistors functioning as one switching element is provided, the plurality of transistors may be connected to each other in parallel, in series, or in combination of a parallel connection and a series connection. In any case, in one or more of the plurality of transistors, a potential applied to the back gate electrode is controlled, and an off-state current or an on-state resistance of the switching element is adjusted in accordance with the output power, whereby power conversion efficiency can be enhanced.

Note that in this specification, the state where the transistors are connected to each other in series means a state where only one of a first terminal and a second terminal of a first transistor is connected to only one of a first terminal and a second terminal of a second transistor. Further, the state in which the transistors are connected to each other in parallel refers to the state in which the first terminal of the first transistor is connected to the first terminal of the second transistor and the second terminal of the first transistor is connected to the second terminal of the second transistor.

Note that switching of the transistor 102 may be performed by pulse width control (PWM) or pulse frequency control (PFM).

Figure 3A:
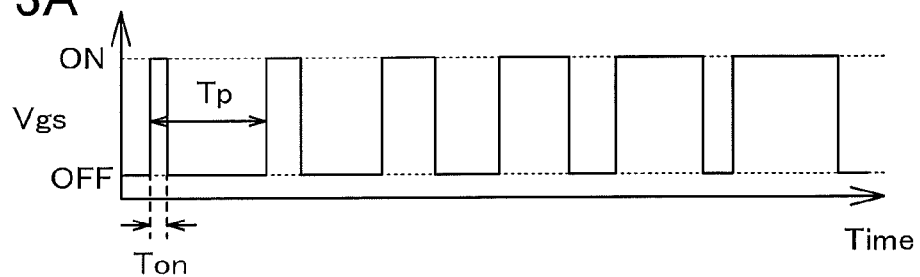
FIGS. 3A to 3D are timing diagrams illustrating operation of a DC-DC converter.

FIG. 3A illustrates an example of a change over time of the gate voltage Vgs of the transistor 102 in the case of using pulse width control. In FIG. 3A, the gate voltage Vgs is pulsed voltage, and a pulse width Ton becomes gradually wider as time passes. In the case of the pulse width control, the time interval Tp between timings at which pulses are generated is constant and the pulse width Ton is variable.

Figure 3B:
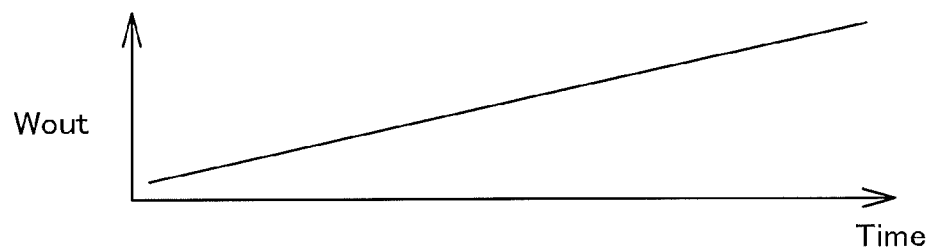

FIG. 3B illustrates a change over time of output power Wout obtained when the switching of the transistor 102 is performed in accordance with the change of the gate voltage Vgs illustrated in FIG. 3A. As illustrated in FIG. 3B, as the pulse width Ton is increased, higher output power Wout can be obtained.

Note that in an embodiment of the present invention, the potential applied to the back gate electrode is controlled in accordance with the strength of the output power Wout, so that the back gate voltage Vbgs between the back gate electrode and the source electrode is adjusted. As an example, FIG. 3C illustrates a change over time of the back gate voltage Vbgs in the case where the output power Wout varies over time as illustrated in FIG. 3B.

Figure 3C:
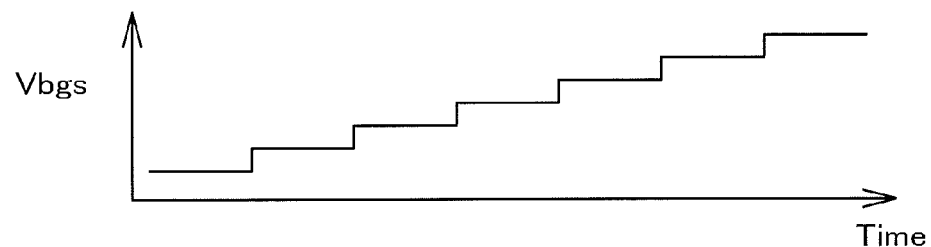

In FIG. 3C, the back gate voltage Vbgs is increased stepwise. In other words, the back gate voltage Vbgs is low in the case where the output power Wout is low, and the back gate voltage Vbgs is high in the case where the output power Wout is high. Accordingly, in the case of low output power Wout, power loss due to the off-state current of the transistor 102 is preferentially suppressed to be low by decreasing the back gate voltage Vdgs to shift the threshold voltage of the transistor 102 in a positive direction, whereby reduction in power conversion efficiency can be prevented. In addition, in the case of high output power Wout, the power loss of the on-state resistance of the transistor 102 is preferentially suppressed to be low by increasing the back gate voltage Vbgs to shift the threshold voltage of the transistor 102, whereby reduction in power conversion efficiency can be prevented.

Note that although in FIG. 3C, the back gate voltage Vbgs has seven levels, an embodiment of the present invention is not limited thereto. As long as the back gate voltage Vbgs can be changed stepwise, the above-described effect can be realized.

Figure 3D:
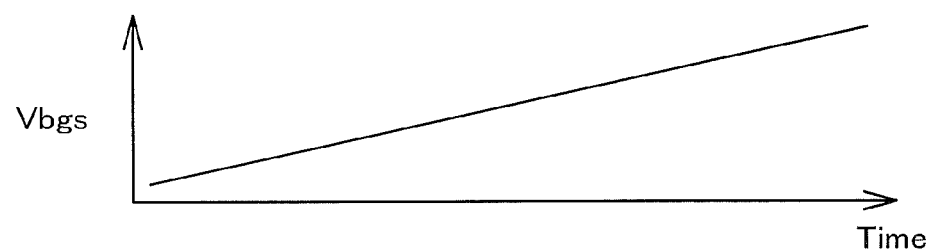

As another example, FIG. 3D illustrates a change over time of the back gate voltage Vbgs in the case where the output power Wout varies over time as illustrated in FIG. 3B. In FIG. 3D, the back gate voltage Vbgs is increased linearly over time.

Alternatively, the back gate voltage Vbgs may be varied in a pulsed manner as the gate voltage Vgs of the transistor 102. In this case, it is preferable that the back gate voltage Vbgs be controlled so that a period in which a pulse of the gate voltage Vgs appears and a period in which a pulse of the back gate voltage Vbgs appears overlap with each other.

Figure 4A:
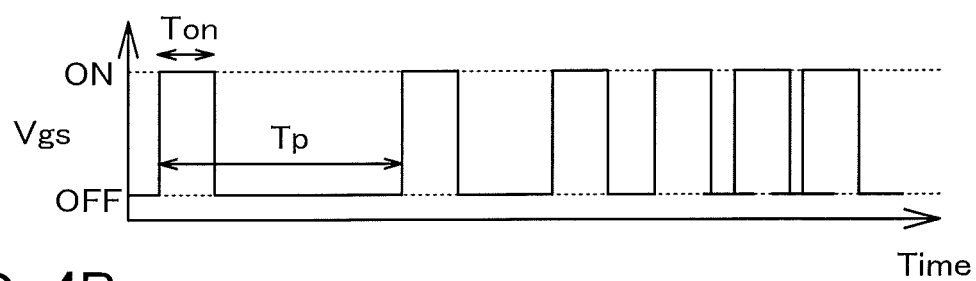
FIGS. 4A and 4B are timing diagrams illustrating operation of a DC-DC converter.

FIG. 4A illustrates an example of a change over time of the gate voltage Vgs of the transistor 102 in the case of employing the pulse frequency control. In FIG. 4A, pulsed voltage is applied to the gate voltage Vgs and the time interval Tp between timings at which pulses are generated is smaller as time passes. In the case of the pulse frequency control, the pulse width Ton is kept constant and the time interval Tp between timings at which pulses are generated is variable.

Figure 4B:
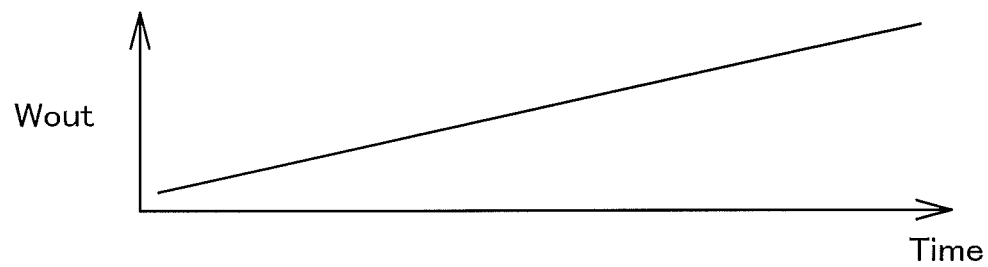

FIG. 4B illustrates a change over time of the output power Wout obtained when switching of the transistor 102 is performed in accordance with the gate voltage Vgs illustrated in FIG. 4A. As illustrated in FIG. 4B, as the time interval Tp between timings at which pulses are generated is smaller as time passes, output power Wout is increased.

Note that in an embodiment of the present invention, the output power may be adjusted by a combination of the pulse width control and the pulse frequency control which are utilized for switching of the transistor 102. In the case of low output power, the frequency of switching of the transistor 102 can be suppressed to be low by the pulse frequency control rather than by the pulse width control; accordingly, the power loss due to switching of the transistor 102 is suppressed to be low. In contrast, in the case of high output power, the frequency of switching of the transistor 102 can be suppressed to be low by the pulse width control rather than by the pulse frequency control; accordingly, power loss due to the switching of the transistor 102 is suppressed to be low. Therefore, the pulse width control and the pulse frequency control may be switched depending on the amount of the output power, whereby power conversion efficiency can be enhanced.

Embodiment 2

In this embodiment, a structure and characteristics of a transistor included in the DC-DC converter of this embodiment of the present invention, and the measurement of the power conversion efficiency of the DC-DC converter including the transistor will be described.

Figure 5A:
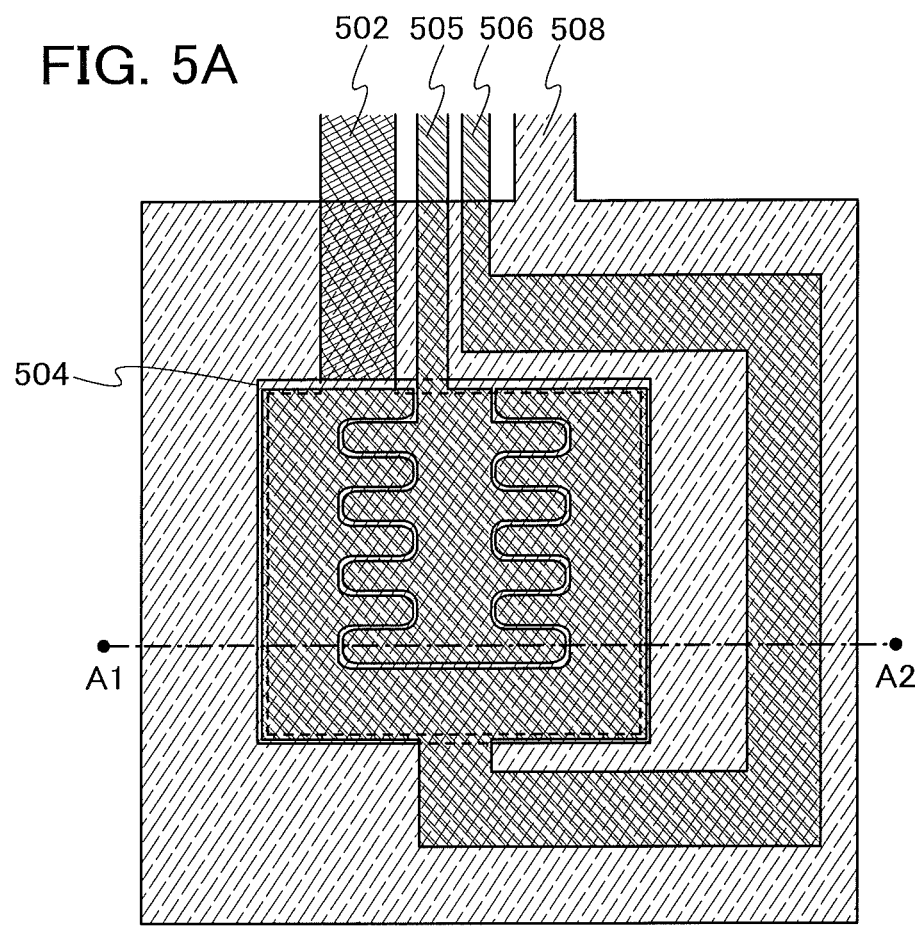
FIG. 5A is a top view of a transistor and FIG. 5B is a cross-sectional view of the transistor.
Figure 5B:
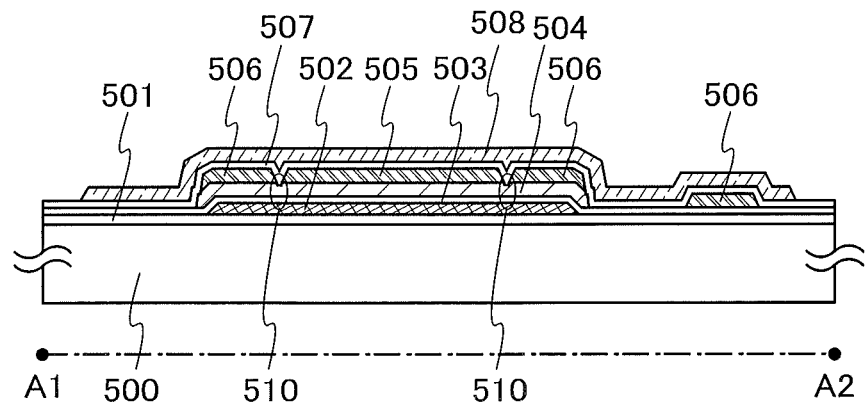

FIG. 5A is an example of a top view of a transistor included in the DC-DC converter according to an embodiment of the present invention. FIG. 5B illustrates a cross-sectional view taken along dashed line A1-A2 in the top view of FIG. 5A.

A transistor in FIGS. 5A and 5B includes the following over a glass substrate 500: an insulating film 501, a back gate electrode 502 which is over the insulating film 501, an insulating film 503 which is over the back gate electrode 502, a semiconductor film 504 which overlaps with the back gate electrode 502 with the insulating film 503 provided therebetween, a source electrode 505 and a drain electrode 506 which are over the semiconductor film 504, an insulating film 507 which covers the semiconductor film 504, the source electrode 505, and the drain electrode 506, a gate electrode 508 which is over the insulating film 507 and which overlaps with the back gate electrode 502 and the semiconductor film 504.

Note that in FIG. 5A, the insulating film 501, the insulating film 503, and the insulating film 507 are omitted to illustrate the structure of the transistor clearly.

Specifically, the insulating film 501 contains silicon oxynitride and has a thickness of approximately 100 nm. The back gate electrode 502 contains tungsten and has a thickness of 150 nm. The insulating film 503 contains silicon oxide and has a thickness of 100 nm. The semiconductor film 504 contains an In—Ga—Zn—O-based oxide semiconductor and has a thickness of 50 nm. The source electrode 505 and the drain electrode 506 each contain titanium and have a thickness of 150 nm. The insulating film 507 contains silicon oxide and has a thickness of 300 nm. The gate electrode 508 contains indium tin oxide including silicon oxide (ITSO) and has a thickness of 150 nm.

Figure 6:
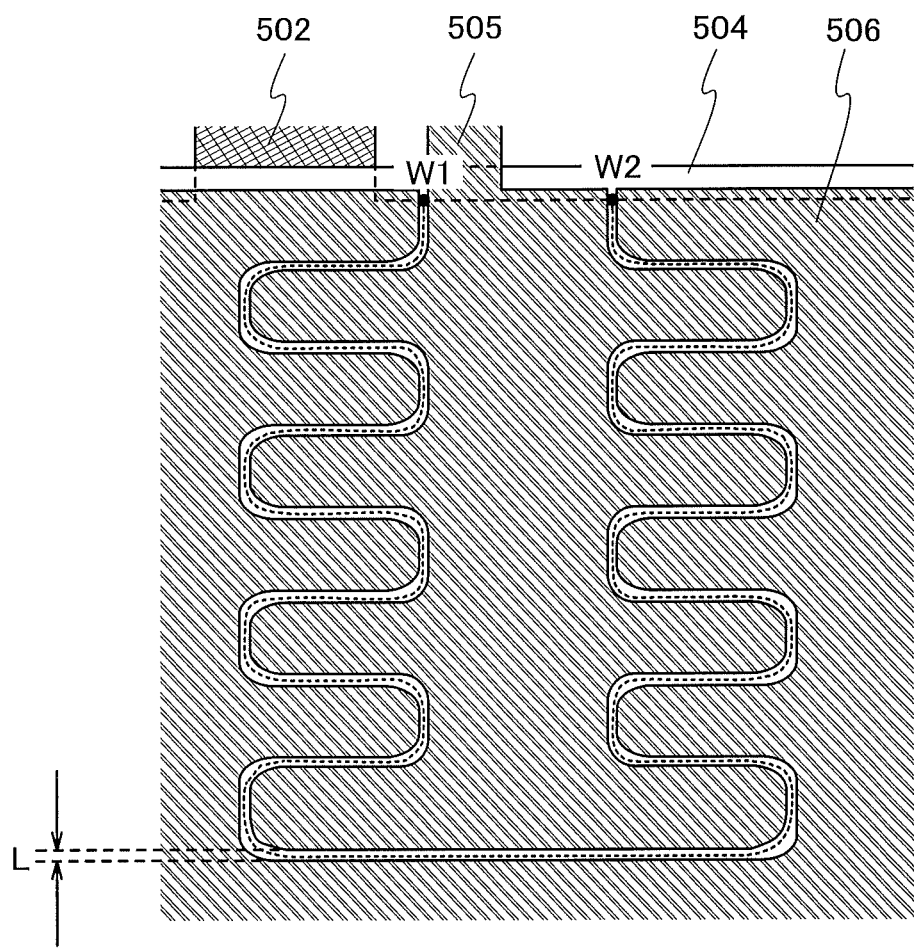
FIG. 6 is a magnified view of part of the top view of the transistor.

Note that as illustrated in FIG. 5B, a channel formation region is a region 510 in the semiconductor film 504, which overlaps with the gate electrode 508 and which presents between the source electrode 505 and the drain electrode 506. FIG. 6 illustrates a magnified view of the vicinity of the channel formation region of the transistor in FIG. 5A. Note that in FIG. 6, the back gate electrode 502 is omitted.

As illustrated in FIG. 6, in the transistor described in this embodiment, the shapes of the source electrode 505 and the drain electrode 506, which are viewed from above, each have a comb shape with projections and depressions. Further, the source electrode 505 and the drain electrode 506 are provided so that projections and depressions of the comb shapes, which are parallel to a surface of the substrate 500 engage with each other and a certain channel length L is kept. Furthermore, a channel width W is the length of the channel formation region in a direction perpendicular to a direction of carrier flow. In FIG. 6, the channel width W corresponds to the length of a dashed line W1-W2.

In this embodiment, the channel length L is 3 μm and the channel width W is 10 cm.

Figure 7:
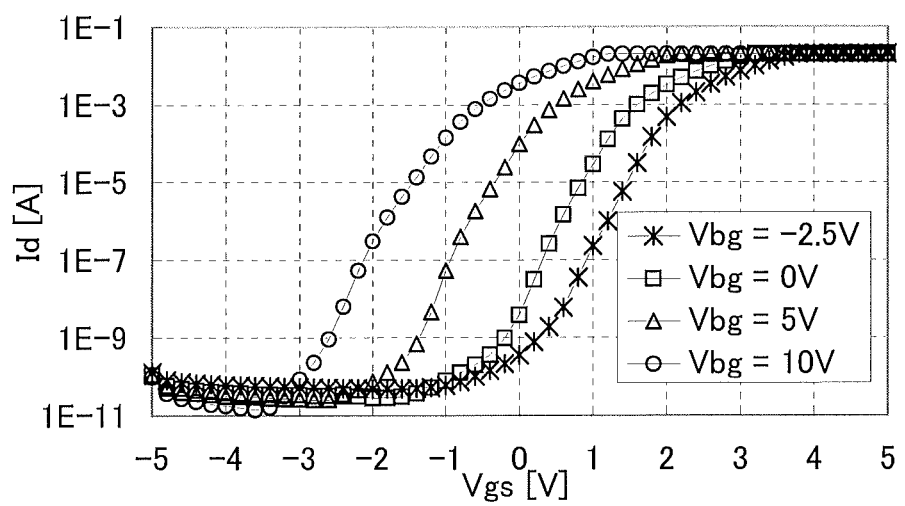
FIG. 7 is a graph illustrating measurement values of drain current Id (A) versus gate voltage Vgs (V).

FIG. 7 illustrates measurement values of drain current Id (A) with respect to the gate voltage Vgs (V) of the transistor with each of the structures in FIG. 5A, FIG. 5B, and FIG. 6. In measurement, the voltage Vds between the source electrode 505 and the drain electrode 506 is 5 V. FIG. 7 illustrates measurement values in the case where the back gate voltage Vbgs between the back gate electrode and the source electrode of the transistor is −2.5 V, 0 V, and 5 V.

As illustrated in FIG. 7, as the back gate voltage Vbgs becomes lower, the threshold voltage of the transistor is shifted to the positive side and the off-state current is reduced. Further, as the back gate voltage Vbgs becomes higher, the threshold voltage of the transistor is shifted to the negative side and the off-state current is increased, that is, on-state resistance is reduced.

Then, the power conversion efficiency of a DC-DC converter including the transistor as a switching element was measured. A power conversion circuit included in the DC-DC converter and used for the measurement has the same structure as the power conversion circuit 101 included in the DC-DC converter in FIG. 2B.

Switching of the transistor 102 was controlled by setting the gate voltage Vgs to 0 V or 5 V. A duty ratio was adjusted by the pulse width control and the frequency of timings at which pulses are generated was set to 97 Hz. Note that the duty ratio corresponds to the percentage of a period in which the gate voltage Vgs of the transistor 102 is 5 V, that is, a period in which the transistor 102 is on, within a certain length of a period. Moreover, the input voltage applied to the input terminal IN1 and the output voltage applied to the output terminal OUT1 were fixed at 5 V and 10 V, respectively. Then, the duty ratio was varied from 40% to 68% and a relation between output power Wout (W) and power conversion efficiency (%) was measurement.

Figure 8:
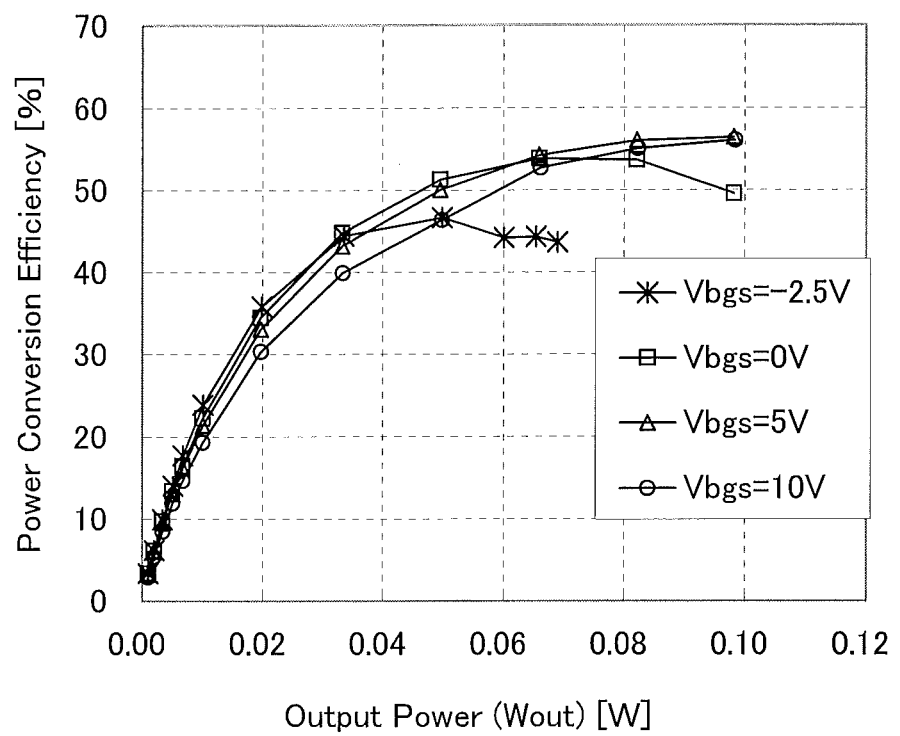
FIG. 8 is a graph illustrating a relation of output power Wout (W) and power conversion efficiency (%).

FIG. 8 illustrates the relation between output power Wout (W) and power conversion efficiency (%), which was obtained by the measurement. As shown in FIG. 8, when the output power Wout is low, the decrease in the back gate voltage Vbgs results in high power conversion efficiency. On the other hand, the power conversion efficiency increases with increasing output power Wont regardless of the back gate voltage Vbgs. However, in the case of low back gate voltage Vbgs, the increase in the power conversion efficiency is saturated and then decreased with increasing output power Wout. In contrast, when the back gate voltage Vbgs is as high as 5 V or 10 V, such a saturation of the increase in power conversion efficiency is not observed, resulting in high power conversion efficiency compared with the case of low back gate voltage Vbgs such as −2.5 V or 0 V.

Hence, in an embodiment of the present invention, as shown in the results illustrated in FIG. 8, with the structure in which the back gate voltage Vbgs is increased in the case of high output power and the back gate voltage Vbgs is decreased in the case of low output power, a DC-DC converter or a power supply circuit having high power conversion efficiency can be obtained.

This embodiment can be implemented by being combined as appropriate with any of the embodiments.

Embodiment 3

In this embodiment, an example of a structure of an output voltage control circuit in the case of employing the pulse width control will be described.

Figure 9:
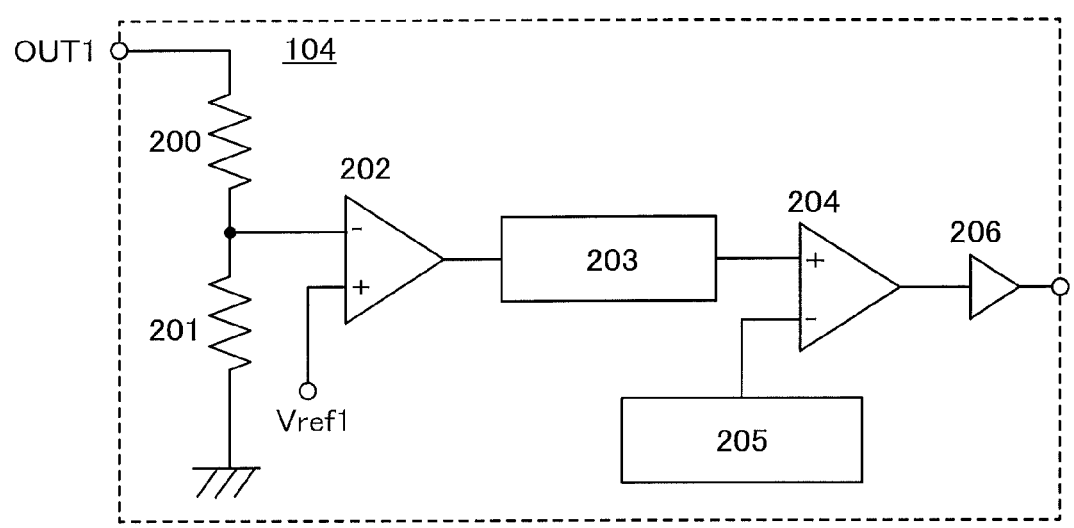
FIG. 9 is a diagram illustrating an example of a structure of an output voltage control circuit.

FIG. 9 schematically illustrates an example of a structure of an output voltage control circuit. The output voltage control circuit 104 in FIG. 9 includes a resistor 200, a resistor 201, an error amplifier 202, a phase compensation circuit 203, a comparator 204, a triangle wave generator 205, and a buffer 206.

The resistor 200 and the resistor 201 are connected in series. One of terminals of the resistor 200 is supplied with the output voltage from the output terminal OUT1 of the DC-DC converter. One of terminals of the resistor 201 is supplied with a fixed potential such as a ground potential. A node in which the other of the terminals of the resistor 200 and the other of the terminals of the resistor 201 are connected is connected to an inverting input terminal (−) of the error amplifier 202. Therefore, the output voltage from the output terminal OUT1 is subjected to resistor division by the resistor 200 and the resistor 201, and is supplied to the inverting input terminal (−) of the error amplifier 202.

A non-inverting input terminal (+) of the error amplifier 202 is supplied with a reference voltage Vref1. In the error amplifier 202, the voltage applied to the inverting input terminal (−) and the reference voltage Vref1 are compared and the difference is amplified; then, the amplified difference is output from an output terminal of the error amplifier 202.

The voltage output from the error amplifier 202 is supplied to the phase compensation circuit 203. The phase compensation circuit 203 controls a phase of voltage output from the error amplifier 202. The phase of the voltage is controlled by the phase compensation circuit 203, so that oscillation of the output voltage of an amplifier such as the error amplifier 202 or the comparator 204 is prevented and the operation of the DC-DC converter can be stabilized.

The voltage output from the phase compensation circuit 203 is supplied to the non-inverting input terminal (+) of the comparator 204. To the inverting input terminal (−) of the comparator 204, a signal with a triangle wave or a sawtooth wave which is output from the triangle wave generator 205 is supplied. The comparator 204 generates a signal with a rectangle wave which has a constant frequency and which has a pulse width varying in accordance with the voltage applied to the non-inverting input terminal (+). The signal with a rectangle wave output from the comparator 204 is output from the output voltage control circuit 104 to a gate electrode of the transistor 102 through the buffer 206.

This embodiment can be implemented by being combined as appropriate with any of the embodiments.

Embodiment 4

In this embodiment, an example of a structure of a back gate control circuit is described.

Figure 10:
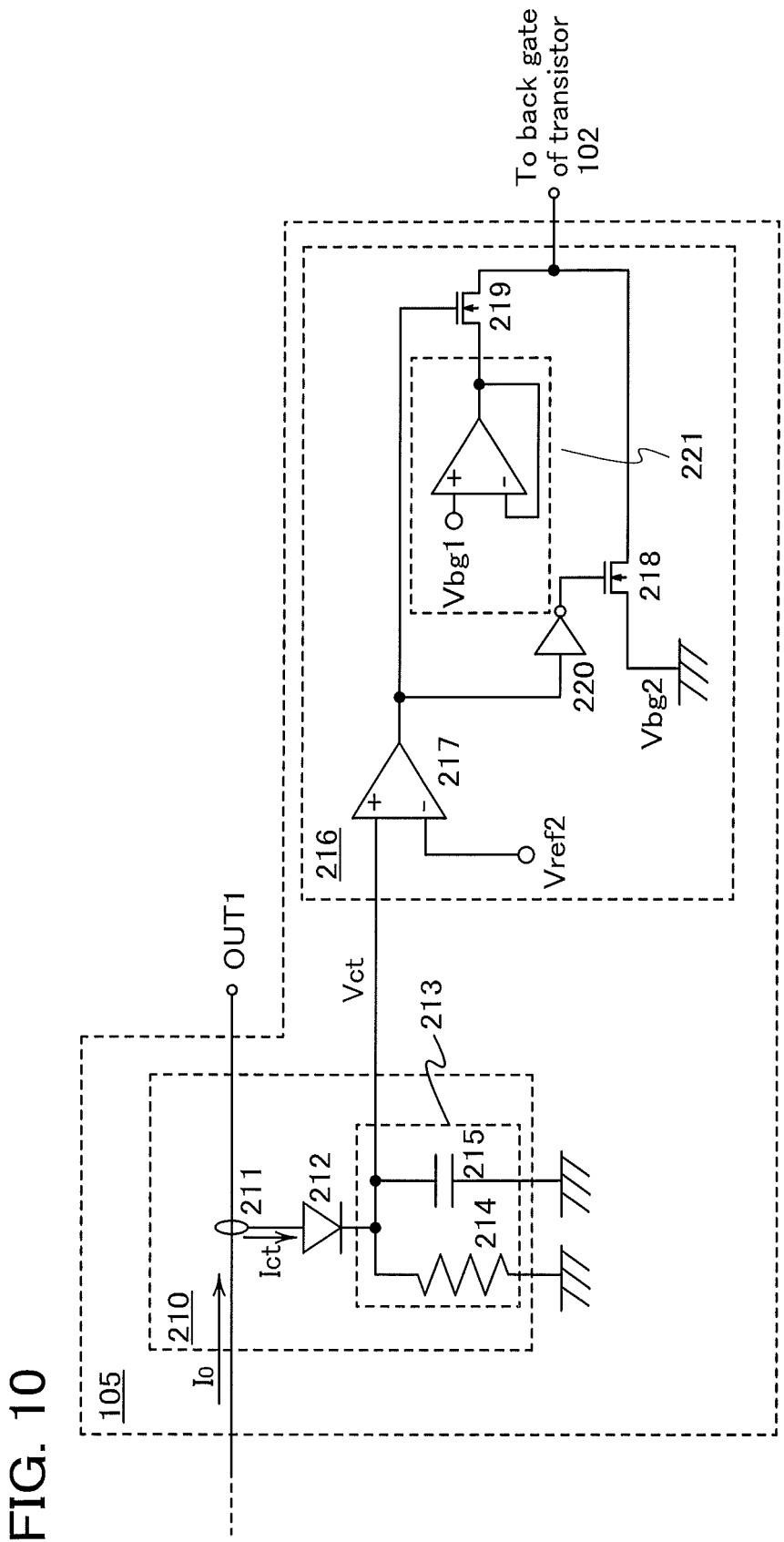
FIG. 10 is a diagram illustrating an example of a structure of a back gate control circuit.

FIG. 10 schematically illustrates an example of a structure of a back gate control circuit. The back gate control circuit 105 in FIG. 10 includes a current detection circuit 210 detecting the amount of current output from the output terminal OUT1, and a power-voltage conversion circuit 216 which determines the potential of the back gate electrode from the amount of the current detected by the current detection circuit 210 and the output voltage from the output terminal OUT1.

Specifically, FIG. 10 illustrates a case where the current detection circuit 210 includes a CT (current transformer) sensor 211, a rectifier 212, and an integrating circuit 213. The CT sensor 211 is provided in adjacent to a conductor such as a wiring which supplies current to the output terminal OUT1. When magnetic flux is generated around the conductor by current flow through the conductor, the current corresponding to the amount of current is generated in the CT sensor 211, obeying the principle of the transformer. For example, assuming that the current flowing to the output terminal OUT1 is $I_O$ and the current generated in the CT sensor 211 is Ict, $I_O$:Ict=N:1 (N>>1) is satisfied. In other words, the CT sensor 211 can generate the extremely low current Ict in proportion to the current $I_O$.

The rectifier 212 rectifies the current generated in the CT sensor 211 and sends the current to the integrating circuit 213. The integrating circuit 213 includes a resistor 214 and a capacitor 215, which are connected in parallel and are provided between the rectifier 212 and a node supplied with a fixed voltage, and functions as a low-pass filter. Accordingly, the integrating circuit 213 converts current rectified by the rectifier 212 into voltage, and outputs the voltage after averaging it. The voltage Vct output from the integrating circuit 213 is applied to the power-voltage conversion circuit 216.

FIG. 10 illustrates a case where the power-voltage conversion circuit 216 includes a comparator 217, an inverter 220, a power source 221, and transistors 218 and 219 functioning as switching elements.

The non-inverting input terminal (+) of the comparator 217 is supplied with the voltage Vct output from the integrating circuit 213, and the inverting input terminal (−) of the comparator 217 is supplied with the output voltage of the output terminal OUT1 or voltage corresponding to the voltage of the output terminal OUT1 as a reference voltage Vref2. The comparator 217 compares the inputted voltage Vct and the reference voltage Vref2, thereby outputting a high-level voltage in the case of the voltage Vct>the reference voltage Vref2 and outputting a low-level voltage in the case of the voltage Vct≤the reference voltage Vref2.

The voltage output from the comparator 217 is supplied to a gate electrode of the transistor 219. Further, the voltage output from the comparator 217 is inverted in the inverter 220 and is applied to a gate electrode of the transistor 218. Accordingly, in the case where the voltage output from the comparator 217 is in a high level, the transistor 218 is turned off and the transistor 219 is turned on; thus, the potential Vbg1 from the power source 221 is output from the power-voltage conversion circuit 216. In the case where the voltage output from the comparator 217 is in a low level, the transistor 218 is turned on and the transistor 219 is turned off; thus, a potential Vbg2 which is a ground potential is output from the power-voltage conversion circuit 216. Note that although the potential Vbg2 is the ground potential in this embodiment, the potential Vbg2 may be a potential other than the ground potential.

The potential Vbg1 or the potential Vbg2 output from the power-voltage conversion circuit 216 is output from the back gate control circuit 105 and is supplied to the back gate electrode of the transistor 102 in FIG. 1A, for example. In other words, the potential supplied to the back gate electrode of the transistor 102 can vary by the back gate control circuit 105 in accordance with the output power of the DC-DC converter.

In an embodiment of the present invention, a potential supplied to the back gate electrode varies in accordance with the current and voltage of the output terminal OUT1, whereby the threshold voltage can be adjusted to decrease the on-state resistance of the transistor 102 in the case of high output power and to decrease the off-state current of the transistor 102 in the case of low output power. Accordingly, the power conversion efficiency of the DC-DC converter can be improved. As illustrated in an embodiment of the present invention, the output power of the DC-DC converter is monitored and the potential of the back gate electrode is controlled in accordance with the output power, whereby the potential of the back gate electrode can be set to have a more appropriate value in comparison with the case where only the output voltage of the DC-DC converter is monitored. As a result, power conversion efficiency can be enhanced.

Further, by using the DC-DC converter, the power conversion efficiency of a power supply circuit can be improved. In addition, the power conversion efficiency of the DC-DC converter is improved; therefore, power consumption of a semiconductor device including the DC-DC converter can be suppressed.

This embodiment can be implemented by being combined as appropriate with any of the embodiments.

Embodiment 5

In this embodiment, an example of a DC-DC converter having the power conversion circuit 101 with a different structure from that in the DC-DC converter illustrated in FIGS. 2A and 2B will be described.

Figure 11A:
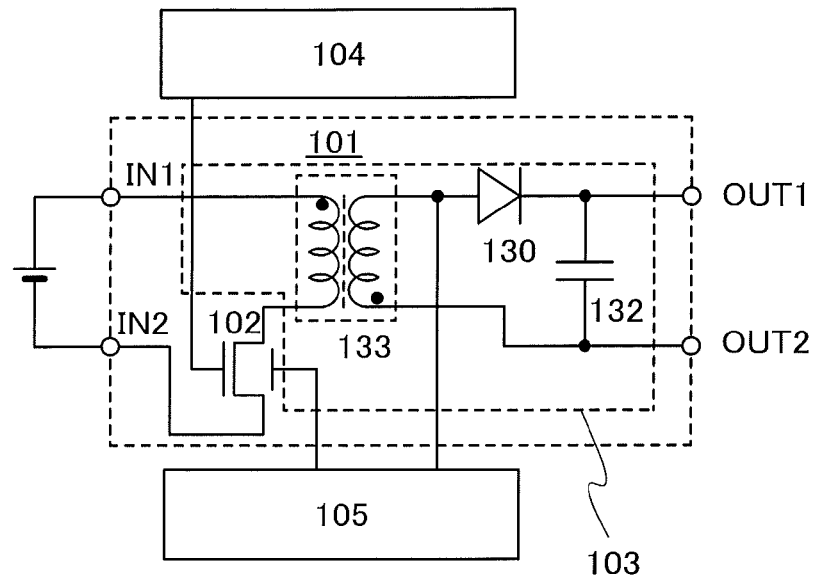
FIGS. 11A and 11B are diagrams each illustrating an example of a structure of a DC-DC converter.

FIG. 11A illustrates a structure of a fly-back DC-DC converter. In the DC-DC converter in FIG. 11A, the constant-voltage generation portion 103 includes the diode 130, the capacitor 132, and a transformer 133. Further, the DC-DC converter in FIG. 11A includes the input terminal IN1 supplied with an input voltage, the input terminal IN2 supplied with a fixed voltage, the output terminal OUT1, and the output terminal OUT2.

The transformer 133 includes a first coil and a second coil in which a common core is provided for each of the centers of the coils. The transistor 102 controls connection between the input terminal IN2 and one of terminals of the first coil of the transformer 133. Specifically, a first terminal of the transistor 102 is connected to the input terminal IN2, and a second terminal of the transistor 102 is connected to the one of the terminals of the first coil of the transformer 133. The other of the terminals of the first coil of the transformer 133 is connected to the input terminal IN1.

One of terminals the second coil of the transformer 133 is connected to the anode of the diode 130 and the other of the terminals of the second coil is connected to the output terminal OUT2. The cathode of the diode 130 is connected to the output terminal OUT1. One of electrodes of the capacitor 132 is connected to the output terminal OUT1 and the other of the electrodes of the capacitor 132 is connected to the output terminal OUT2.

Figure 11B:
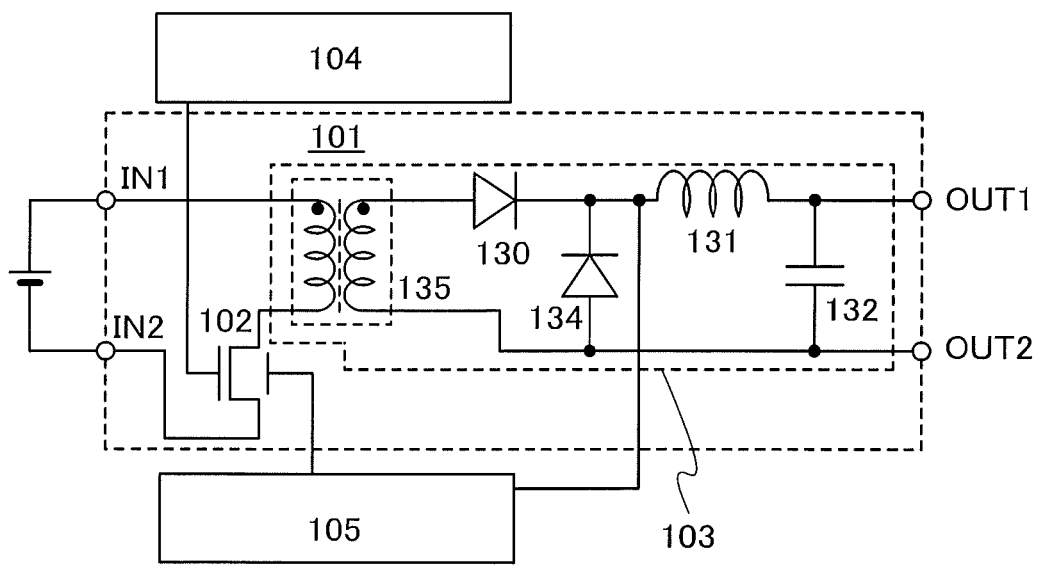

FIG. 11B illustrates a structure of a forward DC-DC converter. In the DC-DC converter in FIG. 11B, the constant-voltage generation portion 103 includes the diode 130, a diode 134, the coil 131, the capacitor 132, and a transformer 135. Further, the DC-DC converter in FIG. 11B includes the input terminal IN1 supplied with the input voltage, the input terminal IN2 supplied with a fixed voltage, the output terminal OUT1, and the output terminal OUT2.

Like the transformer 133 in FIG. 11A, the transformer 135 includes a first coil and a second coil in which a common core is provided for each of the centers of the coils. Note that in the transformer 133, the start end of the first coil and the start end of the second coil are on the opposite side to each other; on the other hand, the start end of the first coil and the start end of the second coil are on the same side in the transformer 135.

The transistor 102 controls connection between the input terminal IN2 and one of terminals of the first coil of the transformer 135. Specifically, the first terminal of the transistor 102 is connected to the input terminal IN2, and the second terminal of the transistor 102 is connected to the one of the terminals of the first coil of the transformer 135. The other of the terminals of the first coil of the transformer 135 is connected to the input terminal IN1.

Further, one of terminals of the second coil of the transformer 135 is connected to the anode of the diode 130 and the other of the terminals of the second coil is connected to the output terminal OUT2. The cathode of the diode 130 is connected to a cathode of the diode 134 and the one of the terminals of the coil 131. An anode of the diode 134 is connected to the output terminal OUT2. The other of the terminals of the coil 131 is connected to the output terminal OUT1. The one of electrodes of the capacitor 132 is connected to the output terminal OUT1 and the other of the electrodes of the capacitor 132 is connected to the output terminal OUT2.

Note that although the structures of the fly-back DC-DC converter and the forward DC-DC converter are described in this embodiment, the DC-DC converter according to an embodiment of the present invention is not limited as long as a switching method is employed in which the output voltage is adjusted by using the duty ratio of a switching element.

This embodiment can be implemented by being combined as appropriate with any of the embodiments.

Embodiment 6

Figure 12:
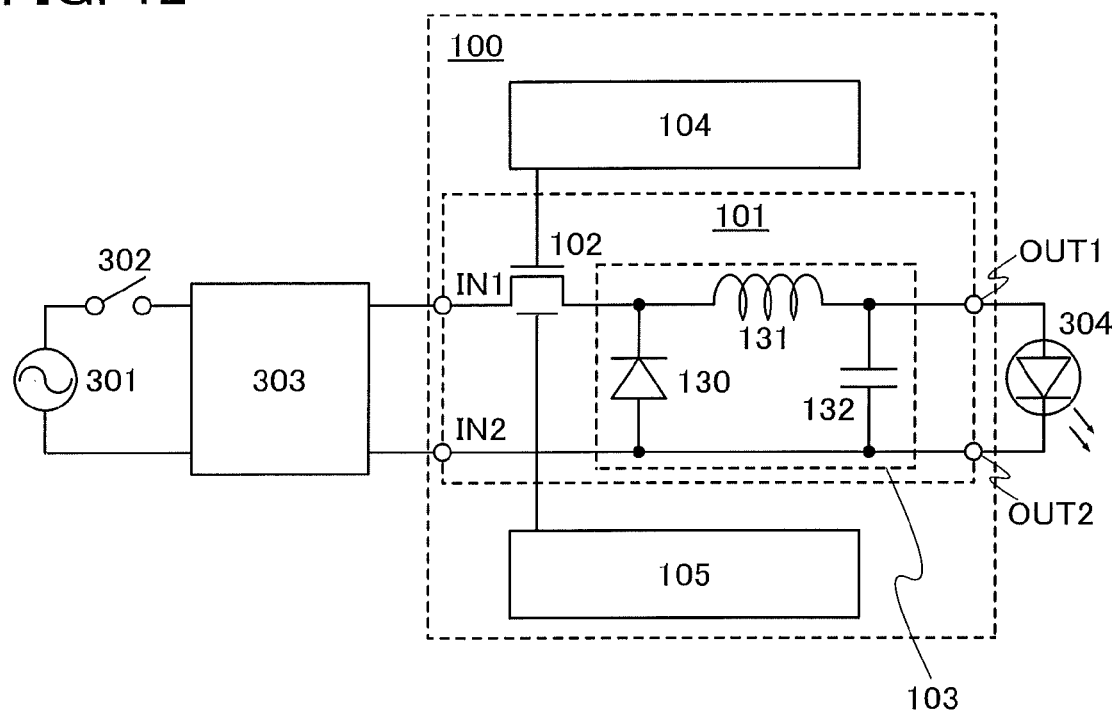
FIG. 12 is a diagram illustrating a structure of a lighting device.

In this embodiment, an example of a lighting device which is one of semiconductor devices according to an embodiment of the present invention will be described. FIG. 12 illustrates an example of a structure of a lighting device.

The lighting device in FIG. 12 includes an AC power source 301, a switch 302, a rectification circuit 303, the DC-DC converter 100, and a light-emitting element 304. The rectification circuit 303 and the DC-DC converter 100 form a power supply circuit.

The DC-DC converter 100 in FIG. 12 has the same structure as that of the step-down DC-DC converter in FIG. 2A. A lighting device according to an embodiment of the present invention does not necessarily include the DC-DC converter 100 in FIG. 2A, and can include a DC-DC converter according to an embodiment of the present invention other than the DC-DC converter 100.

Specifically, in the lighting device in FIG. 12, AC voltage from the AC power source 301 is supplied to the rectification circuit 303 through the switch 302, and rectified. DC voltage obtained by the rectification is input to the DC-DC converter 100 and output after the level is adjusted. Description in Embodiment 1 with reference to FIG. 2A can be referred to for specific operation of the DC-DC converter 100. In this embodiment, the inputted voltage is decreased by the DC-DC converter 100, and output.

The voltage output from the DC-DC converter 100 is supplied to the light-emitting element 304, so that the light-emitting element 304 emits light. As the light-emitting element 304, various light sources such as a light-emitting diode (LED) and an organic light-emitting element (OLED) can be used.

Although in FIG. 12, a lighting device in which the AC power source 301 is used as a power source is illustrated, the present invention is not limited thereto. As the power source, a DC power source may be used instead of an AC power source. Note that in the case of using a DC power source, the rectification circuit 303 is not necessarily provided.

In addition, although in FIG. 12, a structure of a lighting device in which the AC power source 301 is used as a power source is illustrated, a lighting device according to an embodiment of the present invention does not necessarily include a power source as its component.

This embodiment can be implemented by being combined as appropriate with any of the embodiments.

Embodiment 7

Figure 13:
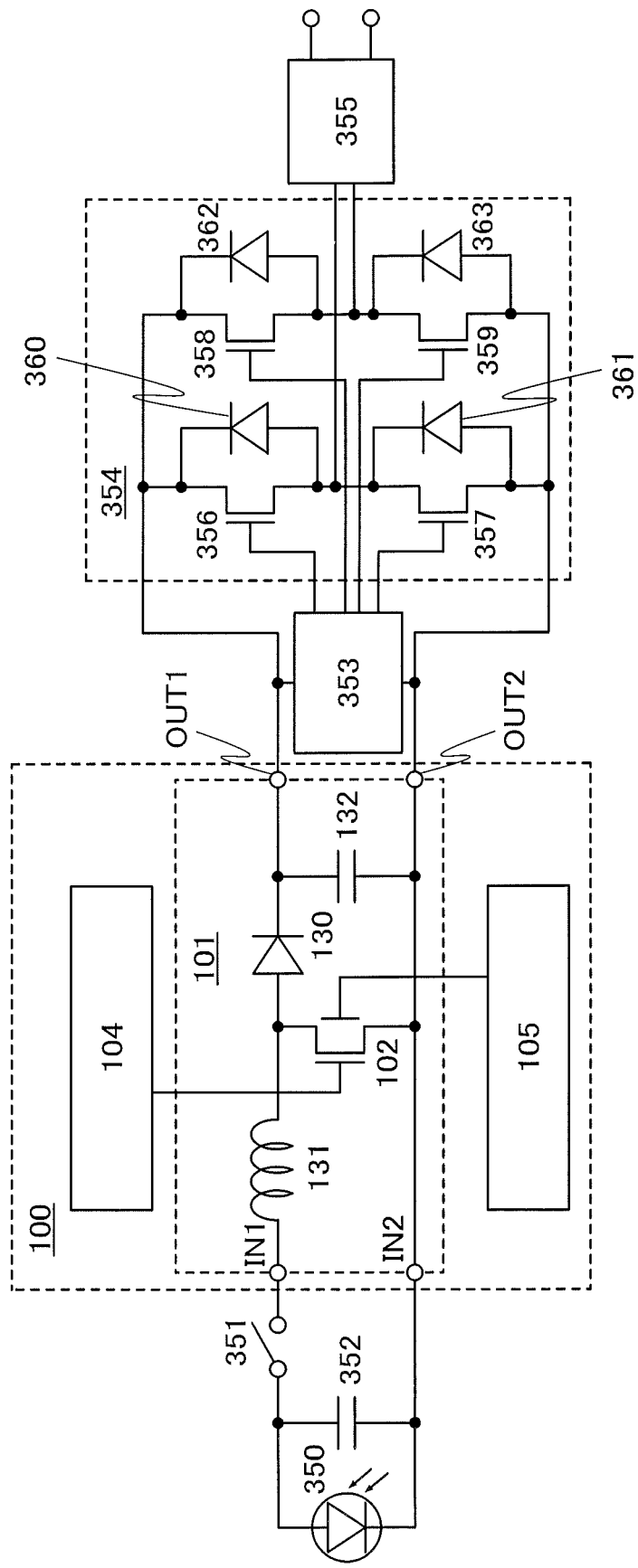
FIG. 13 is a diagram illustrating a structure of a solar cell.

In this embodiment, an embodiment of a solar cell which is one of semiconductor devices according to an embodiment of the present invention will be described. FIG. 13 illustrates an example of a structure of a solar cell.

The solar cell in FIG. 13 includes a photodiode 350, a switch 351, a capacitor 352, the DC-DC converter 100, a pulse width modulation circuit 353, an inverter 354, and a band pass filter 355.

The DC-DC converter 100 in FIG. 13 has the same structure as the step-up DC-DC converter in FIG. 2B. A solar cell according to an embodiment of the present invention does not necessarily include the DC-DC converter 100 in FIG. 2A and can use a DC-DC converter according to an embodiment of the present invention other than the DC-DC converter 100.

Specifically, in the solar cell in FIG. 13, voltage is generated when light is delivered to the photodiode 350. The voltage smoothed by the capacitor 352 is input to the DC-DC converter 100 through the switch 351. Note that with the capacitor 352, the pulsed current generated by switching of the switch 351 can be prevented from flowing through the photodiode 350.

Then, the voltage input to the DC-DC converter 100 is output after the voltage is adjusted by the DC-DC converter 100. Description in Embodiment 1 with reference to FIG. 2B can be referred to for specific operation of the DC-DC converter 100. In this embodiment, the level of the inputted voltage is increased by the DC-DC converter 100, and output.

The voltage output from the output terminal OUT1 of the DC-DC converter 100 is DC voltage. The inverter 354 converts the DC voltage output from the DC-DC converter 100 to AC voltage, and outputs. FIG. 13 illustrates an example of a structure in which the inverter 354 includes four transistors 356 to 359 and four diodes 360 to 363.

Specifically, a first terminal of the transistor 356 is connected to the output terminal OUT1 of the DC-DC converter 100 and a second terminal of the transistor 356 is connected to a first terminal of the transistor 357. A second terminal of the transistor 357 is connected to the output terminal OUT2 of the DC-DC converter 100. A first terminal of the transistor 358 is connected to the output terminal OUT1 of the DC-DC converter 100 and a second terminal of the transistor 358 is connected to a first terminal of the transistor 359. A second terminal of the transistor 359 is connected to the output terminal OUT2 of the DC-DC converter 100. The diodes 360 to 363 are connected to the transistors 356 to 359 in parallel respectively. Specifically, the first terminals of the transistors 356 to 359 are connected to anodes of the diodes 360 to 363, respectively. The second terminals of the transistors 356 to 359 are connected to cathodes of the diodes 360 to 363.

To the pulse width modulation circuit 353, the voltage output from the DC-DC converter 100 is supplied. The pulse width modulation circuit 353 is operated by application of the voltage and generates a signal for controlling switching of the transistors 356 to 359.

The transistors 356 to 359 perform switching in accordance with the signal from the pulse width modulation circuit 353, whereby AC voltage with a PWM waveform is output from a node in which the second terminal of the transistor 356 and the first terminal of the transistor 357 in the inverter 354 are connected and a node in which the second terminal of the transistor 358 and the first terminal of the transistor 359 in the inverter 354 are connected.

Then, a high-frequency component is removed from the AC voltage output from the inverter 354 by using the band pass filter 355, whereby AC voltage with a sine wave can be obtained.

This embodiment can be implemented by being combined as appropriate with any of the embodiments.

Embodiment 8

In this embodiment, a method for fabricating a semiconductor device according to an embodiment of the present invention will be described. The semiconductor device includes a transistor including silicon and a transistor including an oxide semiconductor.

Note that in an embodiment of the present invention, it is only necessary that an oxide semiconductor is used for a transistor functioning as a switching element for controlling the output power of the DC-DC converter. The transistor other than the transistor functioning as a switching element can be formed through a normal CMOS process in which germanium, silicon, silicon germanium, single crystal silicon carbide, or the like is used. For example, the transistor including silicon can be formed using a single crystal semiconductor substrate such as a silicon wafer, a silicon thin film which is formed by an SOI method, a silicon thin film which is formed by a vapor deposition method, or the like.

Figure 14A:
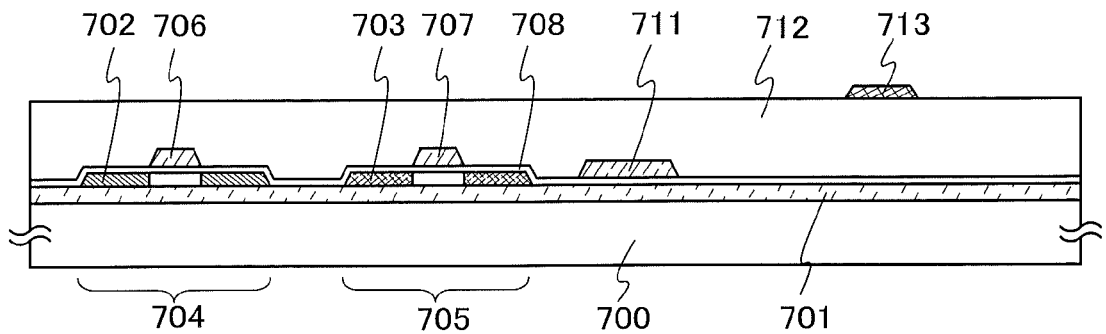
FIGS. 14A to 14D are diagrams illustrating a method for fabricating a semiconductor device.

First, as illustrated in FIG. 14A, an n-channel transistor 704 and the p-channel transistor 705 are formed over an insulating surface of a substrate 700 by a known CMOS fabricating method. In this embodiment, the case where the n-channel transistor 704 and the p-channel transistor 705 are formed using a single crystal semiconductor film which is separated from a single crystal semiconductor substrate is given as an example.

A specific example of a fabricating method of a single crystal semiconductor film is briefly described. First, an ion beam including ions which are accelerated by an electric field enters the single crystal semiconductor substrate and a fragile layer which is fragile because of local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 over which the insulating film 701 is formed are attached to each other so that the insulating film 701 is provided therebetween. After the semiconductor substrate and the substrate 700 overlap with each other, a pressure of greater than or equal to 1 N/cm² and less than or equal to 500 N/cm², preferably greater than or equal to 11 N/cm² and less than or equal to 20 N/cm² is applied to part of the semiconductor substrate and the substrate 700 to attach both the substrates. When the pressure is applied to a portion, bonding between the semiconductor substrate and the insulating film 701 starts from the portion, which results in bonding of the entire surface where the semiconductor substrate and the insulating film 701 are in contact with each other. Subsequently, heat treatment is performed, whereby very small voids that exist in the fragile layer are expanded and combined to form voids with a large volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The n-channel transistor 704 is formed using the island-shaped semiconductor film 702 over the insulating film 701, and the p-channel transistor 705 is formed using the island-shaped semiconductor film 703 over the insulating film 701. The n-channel transistor 704 includes a gate electrode 706, and the p-channel transistor 705 includes a gate electrode 707. The n-channel transistor 704 includes an insulating film 708 between the island-shaped semiconductor film 702 and the gate electrode 706. The p-channel transistor 705 includes the insulating film 708 between the island-shaped semiconductor film 703 and the gate electrode 707.

Although there is no particular limitation on a substrate which can be used as the substrate 700, it is necessary that the substrate have at least enough heat resistance to heat treatment performed later. For example, a glass substrate fabricated by a fusion method or a float method, a quartz substrate, a ceramic substrate, or the like can be used as the substrate 700. Further, when the temperature of heat treatment performed later is high, a substrate having a strain point of greater than or equal to 730° C. is preferably used as the glass substrate. Further, a metal substrate such as a stainless-steel substrate or a substrate in which an insulating film is formed on the surface of a silicon substrate may be used as well. Although a substrate formed of a flexible synthetic resin such as plastic generally has a lower resistance temperature than the aforementioned substrates, it may be used as long as being resistant to a processing temperature during fabricating steps.

Note that although the case where the n-channel transistor 704 and the p-channel transistor 705 are formed using the single crystal semiconductor film is illustrated as an example in this embodiment, the present invention is not limited to this structure. For example, a polycrystalline or microcrystalline semiconductor film which is formed over the insulating film 701 by a vapor deposition method may be used. Alternatively, the above semiconductor film may be formed by crystallization of amorphous silicon with a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, a crystallization method combined with a thermal crystallization method using an electrically heated oven, a lamp annealing crystallization method using infrared light, a crystallization method using a catalytic element, or a high-temperature annealing method at approximately 950° C., may be used.

In FIG. 14A, after a conductive film is formed over the insulating film 708, the conductive film is processed into a desired shape by etching or the like, whereby a wiring 711 connected to the gate electrode 701 is formed together with the gate electrode 709 and the gate electrode 710.

Next, as illustrated in FIG. 14A, an insulating film 712 is formed so as to cover the n-channel transistor 704, the p-channel transistor 705, and the wiring 711. Note that although the case where the insulating film 712 is formed in a single layer is illustrated as an example in this embodiment, the insulating film 712 is not necessarily a single layer and insulating films of two or more layers may be stacked as the insulating film 712.

The insulating film 712 is formed using materials which can withstand a temperature of heat treatment in a later fabricating step. Specifically, it is preferable to use silicon oxide, silicon nitride, silicon nitride oxide, silicon oxynitride, aluminum nitride, aluminum oxide, or the like for the insulating film 712.

A surface of the insulating film 712 may be planarized by CMP or the like.

Next, as illustrated in FIG. 14A, a gate electrode 713 is formed over the insulating film 712.

The gate electrode 713 can be formed to have a single-layer structure or a stacked-layer structure using one or more conductive films including a metal such as molybdenum, titanium, chromium, tantalum, tungsten, neodymium, or scandium or an alloy which contains any of these metals as a main component, or a nitride of any of these metals. Note that aluminum or copper can also be used as such metals if aluminum or copper can withstand a temperature of heat treatment performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer stacked structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, a mixed oxide of indium oxide and tin oxide, a mixed oxide of indium oxide and zinc oxide, zinc oxide, zinc aluminum oxide, zinc aluminum oxynitride, zinc gallium oxide, or the like can also be used as the gate electrode 713.

The thickness of the gate electrode 713 is in the range of 10 mm to 400 nm, preferably 100 nm to 200 nm. In this embodiment, after the conductive film for the gate electrode is formed to have a thickness of 150 nm by a sputtering method using a tungsten target, the conductive film is processed (patterned) into a desired shape by etching, whereby the gate electrode 713 is formed. Note that when end portions of the formed gate electrode are tapered, coverage with a gate insulating film stacked thereover is improved, which is preferable. Note that a resist mask may be formed by an ink-jet method. Formation of the resist mask by an ink jet method needs no photomask; thus, fabricating cost can be reduced.

Figure 14B:
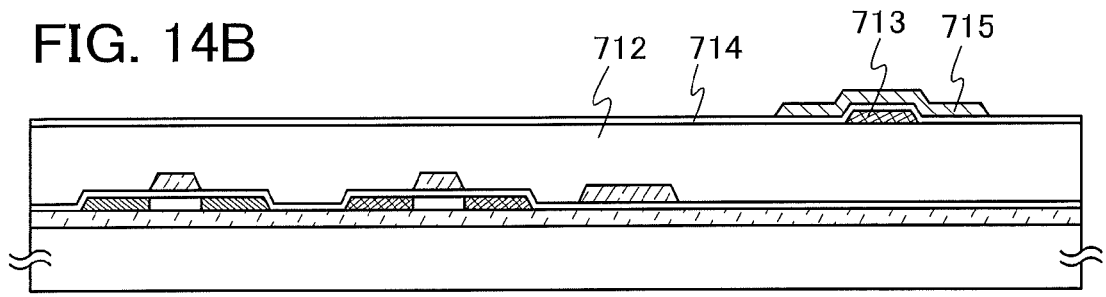

Next, as illustrated in FIG. 14B, a gate insulating film 714 is formed over the gate electrode 713. The gate insulating film 714 can be formed to have a single-layer structure or a stacked-layer structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like. It is preferable that the gate insulating film 714 contains as little impurities such as moisture and hydrogen as possible. In the case where a silicon oxide film is formed by a sputtering method, a silicon target or a quartz target is used as a target, and oxygen or a mixed gas of oxygen and argon is used as a sputtering gas.

An oxide semiconductor that is made to be an intrinsic oxide semiconductor or a substantially intrinsic oxide semiconductor (the oxide semiconductor that is highly purified) by removal of impurities is extremely sensitive to an interface state and an interface electric charge; thus, an interface between the highly purified oxide semiconductor and the gate insulating film 714 is important. Therefore, the gate insulating film (GI) that is in contact with the highly purified oxide semiconductor needs to have higher quality.

For example, high-density plasma CVD using microwaves (e.g., a frequency of 2.45 GHz) is preferable because a dense high-quality insulating film having high withstand voltage can be formed. This is because when the highly purified oxide semiconductor is in contact with the high-quality gate insulating film, the interface state can be reduced and favorable interface characteristics can be obtained.

Needless to say, a different film formation method such as a sputtering method or a plasma CVD method can be used as long as a high-quality insulating film can be formed as a gate insulating film. Moreover, it is possible to form an insulating film whose quality and characteristics of an interface with the oxide semiconductor are improved through heat treatment performed after the formation of the insulating film. In any case, an insulating film that has favorable film quality as the gate insulating film and can reduce interface state density with the oxide semiconductor to form a favorable interface is formed.

The gate insulating film 714 may be formed to have a structure in which an insulating film formed using a material having a high barrier property and an insulating film having lower proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property is used, so that impurities in an atmosphere, such as moisture or hydrogen, or impurities in the substrate, such as an alkali metal or a heavy metal, can be prevented from entering the oxide semiconductor film, the gate insulating film 714, or the interface between the oxide semiconductor film and another insulating film and the vicinity thereof. In addition, the insulating film having lower proportion of nitrogen, such as a silicon oxide film or a silicon oxynitride film, is formed so as to be in contact with the oxide semiconductor film, so that the insulating film having a high barrier property can be prevented from being in direct contact with the oxide semiconductor film.

For example, a silicon nitride film ($SiN_y$ (y>0)) with a thickness of greater than or equal to 50 nm and less than or equal to 200 nm is formed by a sputtering method as a first gate insulating film, and a silicon oxide film ($SiO_x$ (x>0)) with a thickness of greater than or equal to 5 nm and less than or equal to 300 nm is stacked over the first gate insulating film as a second gate insulating film; thus, these films may be used as the gate insulating film 714 having a thickness of 100 nm. The thickness of the gate insulating film 714 may be set as appropriate depending on characteristics needed for the transistors and may be approximately 350 nm to 400 nm.

In this embodiment, the gate insulating film 714 having a structure in which a silicon oxide film having a thickness of 100 nm formed by a sputtering method is stacked over a silicon nitride film having a thickness of 50 nm formed by a sputtering method is formed.

Note that the gate insulating film is in contact with the oxide semiconductor layer to be formed later. When hydrogen is contained in the oxide semiconductor, characteristics of the transistor are adversely affected; therefore, it is preferable that the gate insulating film do not contain hydrogen, a hydroxyl group, and moisture. In order that the gate insulating film 714 contains as little hydrogen, a hydroxyl group, and moisture as possible, it is preferable that an impurity adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

Next, over the gate insulating film 714, an oxide semiconductor film having a thickness of greater than or equal to 2 nm and less than or equal to 200 nm, preferably greater than or equal to 3 nm and less than or equal to 50 nm, or more preferably greater than or equal to 3 nm and less than or equal to 20 nm is formed. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust left over a surface of the gate insulating film 714 is preferably removed by reverse sputtering in which an argon gas is introduced and plasma is generated. The reverse sputtering refers to a method in which, without application of voltage to a target side, an RF power source is used for application of voltage to a substrate side under an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As described above, examples of the oxide semiconductor film include a quaternary metal oxide such as an In—Sn—Ga—Zn—O-based oxide semiconductor; ternary metal oxides such as an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nb—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, an In—Lu—Zn—O-based oxide semiconductor; binary metal oxides such as an In—Zn—O-based oxide semiconductor, an Sn—Zn—O-based oxide semiconductor, an Al—Zn—O-based oxide semiconductor, a Zn—Mg—O-based oxide semiconductor, an Sn—Mg—O-based oxide semiconductor, an In—Mg—O-based oxide semiconductor, and an In—Ga—O-based oxide semiconductor; an In—O-based oxide semiconductor; an Sn—O-based oxide semiconductor; and a Zn—O-based oxide semiconductor.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the above target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target including In, Ga, and Zn is greater than or equal to 90% and less than or equal to 100%, preferably greater than or equal to 95% and less than 100%. With the use of the target with high filling rate, a dense oxide semiconductor film is formed.

When an In—Zn—O based material is used as the oxide semiconductor, a target to be used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), or more preferably In:Zn=1.5:1 to 15:1 in an atomic ratio ($In_2O_3:ZnO=3:4$ to 15:2 in a molar ratio). For example, when a target used for forming the In—Zn—O-based oxide semiconductor has a composition ratio of In:Zn:O=X:Y:Z in an atomic ratio, $Z>(1.5X+Y)$ is satisfied. The mobility can be improved by keeping the ratio of Zn within the above range.

In this embodiment, the oxide semiconductor film is formed over the substrate 700 in such a manner that the substrate is held in the treatment chamber kept at reduced pressure, a sputtering gas from which hydrogen and moisture have been removed is introduced into the treatment chamber while residual moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a clyopump, an ion pump, or a titanium sublimation pump is preferably used. The exhaustion unit may be a turbo pump provided with a cold trap. In the film formation chamber which is exhausted with the clyopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

In order that the oxide semiconductor film contains as little hydrogen, a hydroxyl group, and moisture as possible, it is preferable that an impurity adsorbed on the substrate 700, such as moisture or hydrogen, be eliminated and removed by preheating the substrate 700, over which films up to the gate insulating film 714 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can also be omitted. This preheating may be similarly performed on the substrate 700 over which layers up to and including an electrode 716, an electrode 717, and an electrode 718 are formed before the formation of an insulating film 723 which will be formed later.

Next, as illustrated in FIG. 14B, the oxide semiconductor film is processed (patterned) into a desired shape by etching or the like, whereby an island-shaped oxide semiconductor film 715 is formed over the gate insulating film 714 so that the island-shaped oxide semiconductor film 715 overlaps with the gate electrode 713.

A resist mask for forming the island-shaped oxide semiconductor film 715 may be formed by an ink-jet method. Formation of the resist mask by an ink-jet method needs no photomask; thus, fabricating cost can be reduced.

Note that etching for forming the island-shaped oxide semiconductor film 715 may be wet etching, dry etching, or both dry etching and wet etching. As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, ITO-07N (produced by KANTO CHEMICAL CO., INC.) may be used. The etchant after the wet etching is removed by cleaning together with the etched materials. The waste liquid including the etchant and the material etched off may be purified and the material may be reused. When a material such as indium included in the oxide semiconductor film is collected from the waste liquid after the etching and reused, the resources can be efficiently used and the cost can be reduced.

Note that it is preferable that reverse sputtering be performed before the formation of a conductive film in a subsequent step so that a resist residue or the like that is attached to surfaces of the island-shaped oxide semiconductor film 715 and the gate insulating film 714 is removed.

Note that, in some cases, the oxide semiconductor film formed by sputtering or the like includes a large amount of moisture or hydrogen as impurities. Moisture and hydrogen easily form a donor level and thus serve as impurities in the oxide semiconductor. Thus, in an embodiment of the present invention, in order to reduce an impurity such as moisture or hydrogen in the oxide semiconductor film, heat treatment is performed on the oxide semiconductor film 715 under a nitrogen atmosphere, an oxygen atmosphere, an atmosphere of ultra-dry air, or a rare gas (e.g., argon and helium) atmosphere. It is preferable that the content of water in the gas be 20 ppm or less, preferably 1 ppm or less, or more preferably 10 ppb or less.

Heat treatment performed on the oxide semiconductor film 715 can eliminate moisture or hydrogen in the oxide semiconductor film 715. Specifically, heat treatment may be performed at a temperature higher than or equal to 300° C. and lower than or equal to 700° C., preferably higher than or equal to 300° C. and lower than or equal to 500° C. For example, heat treatment may be performed at 500° C. for longer than or equal to three minutes and shorter than or equal to six minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

Note that it is preferable that in the heat treatment, moisture, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Through the above process, the concentration of hydrogen in the oxide semiconductor film 715 can be reduced and the oxide semiconductor film 715 can be highly purified. Thus, the characteristics of the oxide semiconductor film can be stabilized. In addition, heat treatment at a temperature of lower than or equal to the glass transition temperature makes it possible to form an oxide semiconductor film whose band gap is wide and whose carrier density is extremely low. Therefore, the transistor can be fabricated using a large-sized substrate, so that the productivity can be increased. In addition, by using the highly purified oxide semiconductor film in which the hydrogen concentration is reduced, it is possible to manufacture a transistor with high withstand voltage and a high on-off ratio.

Note that in the case where the oxide semiconductor film is heated, although depending on a material of the oxide semiconductor film or heating conditions, plate-shaped crystals are formed at the surface of the oxide semiconductor film in some cases. The plane-like crystal is preferably a single crystal which is c-axis-aligned in a direction perpendicular to a surface of the oxide semiconductor film. Even if the plate-like crystals are not single crystal bodies, each crystal is preferably a polycrystalline body which is c-axis-aligned in a direction substantially perpendicular to the surface of the oxide semiconductor film. Further, it is preferable that the polycrystalline bodies be c-axis-aligned and that the a-b planes of crystals correspond, or the a-axis or the b-axis of the crystals be aligned with each other. Note that when a base surface of the oxide semiconductor film is uneven, a plane-like crystal is a polycrystal. Therefore, the surface of the base is preferably as even as possible.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Figure 14C:
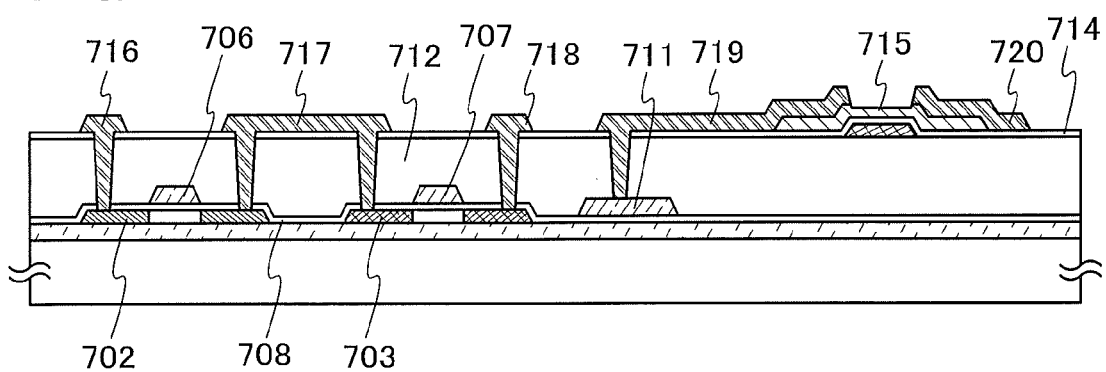

Then, a conductive film is formed so as to cover the oxide semiconductor film 715 by a sputtering method or a vacuum vapor deposition method. After that, the conductive film is patterned by etching or the like, so that the electrodes 716 to 718 which each function as a source electrode, a drain electrode, or a wiring are formed as illustrated in FIG. 14C.

Note that the electrodes 716 and 717 are in contact with the island-shaped semiconductor film 702. The electrodes 717 and 718 are in contact with the island-shaped semiconductor film 703. An electrode 719 is in contact with the wiring 711 and the oxide semiconductor film 715, and an electrode 720 is in contact with the oxide semiconductor film 715.

As the material of the conductive film of the electrodes 716 to 718, any of the following materials can be used: an element selected from aluminum, chromium, copper, tantalum, titanium, molybdenum, or tungsten; an alloy including any of these elements; an alloy film including the above elements in combination; or the like. Alternatively, a structure may be employed in which a layer of a high-melting-point metal such as chromium, tantalum, titanium, molybdenum, or tungsten is stacked over or below a metal film of aluminum or copper. Aluminum or copper is preferably combined with a refractory metal material so as to prevent a heat resistance problem and a corrosive problem. As the refractory metal material, molybdenum, titanium, chromium, tantalum, tungsten, neodymium, scandium, yttrium, or the like can be used.

Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

Alternatively, the conductive film for forming the electrodes 716 to 718 may be formed using conductive metal oxide. As a conductive metal oxide, indium oxide, tin oxide, zinc oxide, a mixed oxide of indium oxide and tin oxide, a mixed oxide of indium oxide and zinc oxide, or the metal oxide material to which silicon or silicon oxide is added can be used.

In the case where heat treatment is performed after formation of the conductive film, the conductive film preferably has heat resistance enough to withstand the heat treatment.

Note that each material and etching conditions are adjusted as appropriate so that the oxide semiconductor film 715 is not removed in etching of the conductive film as much as possible. Depending on etching conditions, an exposed portion of the island-shaped oxide semiconductor film 715 may be partly etched, so that a groove (a recessed portion) is formed in some cases.

In this embodiment, a titanium film is used for the conductive film. Therefore, wet etching can be selectively performed on the conductive film using a solution (ammonia hydrogen peroxide mixture) containing ammonia and hydrogen peroxide water; however, the oxide semiconductor film 715 is partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of a process can be realized.

Next, plasma treatment is performed using a gas such as $N_2O$, $N_2$, or Ar. By the plasma treatment, water or the like which is adsorbed to an exposed surface of the oxide semiconductor film is removed. Plasma treatment may be performed using a mixed gas of oxygen and argon as well.

Figure 14D:
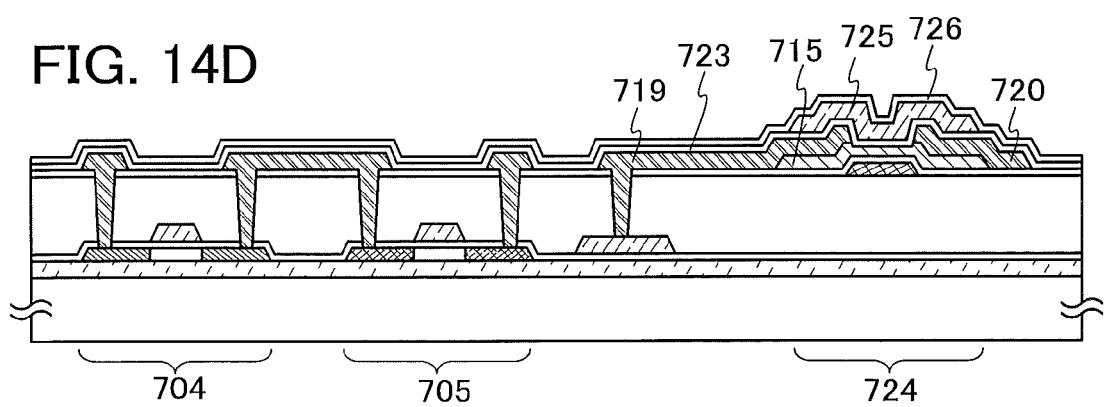

After the plasma treatment, as illustrated in FIG. 14D, the insulating film 723 is formed so as to cover the electrodes 716 to 718 and the oxide semiconductor film 715. The insulating film 723 preferably contains as little impurities such as moisture, hydrogen, and oxygen as possible. An insulating film of a single layer or a plurality of insulating films stacked may be employed for the insulating film 723. When hydrogen is contained in the insulating film 723, entry of the hydrogen to the oxide semiconductor film or extraction of oxygen in the oxide semiconductor film by the hydrogen occurs, whereby a back channel portion of the oxide semiconductor film has lower resistance (n-type conductivity); thus, a parasitic channel might be formed. Therefore, it is important that a film formation method in which hydrogen is not used be employed in order to form the insulating film 723 containing as little hydrogen as possible. A material having a high barrier property is preferably used for the insulating film 723. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having lower proportion of nitrogen, such as a silicon oxide film or a silicon oxynitride film, is formed on the side closer to the oxide semiconductor film 715 than the insulating film having a high barrier property. Then, the insulating film having a high barrier property is formed so as to overlap with the electrodes 716 to 718 and the oxide semiconductor film 715 with the insulating film having lower proportion of nitrogen provided between the insulating film having a barrier property, and the electrodes 716 to 718 and the oxide semiconductor film 715. By using the insulating film having a high barrier property, the impurities such as moisture or hydrogen can be prevented from entering the oxide semiconductor film 715, the gate insulating film 714, or the interface between the oxide semiconductor film 715 and another insulating film and the vicinity thereof. In addition, the insulating film having lower proportion of nitrogen, such as a silicon oxide film or a silicon oxynitride film, is formed so as to be in contact with the oxide semiconductor film 715, so that the insulating film having a high barrier property can be prevented from being in direct contact with the oxide semiconductor film 715.

In this embodiment, the insulating film 723 having a structure in which a silicon nitride film having a thickness of 100 nm formed by a sputtering method is stacked over a silicon oxide film having a thickness of 200 nm formed by a sputtering method is formed. The substrate temperature in film formation may be higher than or equal to room temperature and lower than or equal to 300° C. and in this embodiment, is 100° C.

After the insulating film 723 is formed, heat treatment may be performed. The heat treatment is performed under a nitrogen atmosphere, an oxygen atmosphere, an atmosphere of ultra-dry air (air in which the water content is less than or equal to 20 ppm, preferably less than or equal to 1 ppm, or more preferably less than or equal to 10 ppb), or a rare gas (e.g., argon and helium) atmosphere at preferably a temperature higher than or equal to 200° C. and lower than or equal to 400° C., for example, higher than or equal to 250° C. and lower than or equal to 350° C. In this embodiment, for example, heat treatment at 250° C. under a nitrogen atmosphere for 1 hour is performed. Alternatively, RTA treatment for a short time at a high temperature may be performed before the formation of the electrodes 716 to 720 in a manner similar to that of the previous heat treatment performed on the oxide semiconductor film. Even when oxygen deficiency occurs in the oxide semiconductor film 715 due to the previous heat treatment performed on the oxide semiconductor film, the insulating film 723 containing oxygen is provided and then heat treatment is performed, whereby oxygen is supplied from the insulating film 723 to the oxide semiconductor film 715. Therefore, when oxygen is supplied to the region of the oxide semiconductor film 715, oxygen deficiency serving as a donor can be reduced and the stoichiometric composition ratio can be satisfied in the oxide semiconductor film 715. As a result, the oxide semiconductor film 715 can be made to be an i-type semiconductor film or a substantially i-type semiconductor film. Accordingly, electric characteristics of the transistor can be improved and variation in the electric characteristics thereof can be reduced. The timing of this heat treatment is not particularly limited as long as it is after the formation of the insulating film 723. When this heat treatment also serves as heat treatment in another step (e.g., heat treatment at the time of formation of a resin film or heat treatment for reducing the resistance of a transparent conductive film), the oxide semiconductor film 715 can be intrinsic or substantially intrinsic without an increase in the number of steps.

Moreover, the oxygen deficiency that serves as a donor in the oxide semiconductor film 715 may be reduced by subjecting the oxide semiconductor film 715 to heat treatment under an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more preferably greater than or equal to 7N (99.99999%) (that is, the impurity concentration in the oxygen is less than or equal to 1 ppm, or preferably less than or equal to 0.1 ppm).

Alternatively, an ion implantation method, an ion doping method, or the like may be employed to add oxygen to the oxide semiconductor film 715 so that oxygen deficiency as a donor is reduced. For example, oxygen made to be plasma with a microwave of 2.45 GHz may be added to the oxide semiconductor film 715.

Next, as illustrated in FIG. 14D, after a conductive film is formed over the insulating film 723, the conductive film is patterned, so that a back gate electrode 725 is formed so that the back gate electrode overlaps with the oxide semiconductor film 715. Then, after the back gate electrode 725 is formed, an insulating film 726 is formed so as to cover the back gate electrode 725. The back gate electrode 725 can be formed using a material and a structure similar to those of the gate electrode 713 or the electrodes 716 to 718.

The thickness of the back gate electrode is in the range of 10 nm to 400 nm, preferably 100 nm to 200 nm. For example, the back gate electrode 725 may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above steps, a transistor 724 is formed.

The transistor 724 includes the gate electrode 713, the gate insulating film 714 over the gate electrode 713, the oxide semiconductor film 715 which is over the gate insulating film 714 and overlaps with the gate electrode 713, a pair of the electrode 719 and the electrode 720 formed over the oxide semiconductor film 715, the insulating film 723 which is formed over the oxide semiconductor film 715, and the back gate electrode 725 which is over the insulating film 723 and which overlaps with the oxide semiconductor film 715. In addition, the insulating film 726 may be included as a component of the transistor 724. The transistor 724 in FIG. 14D has a channel-etched structure in which part of the oxide semiconductor film 715 is etched between the electrode 719 and the electrode 720.

Although description is given using a single-gate transistor as the transistor 724, a multi-gate transistor including a plurality of channel formation regions by including the plurality of gate electrodes 713 that are electrically connected to each other may be formed as needed.

This embodiment can be implemented by being combined as appropriate with any of the embodiments.

Embodiment 9

In this embodiment, a transistor having a structure different from that in Embodiment 8 and including an oxide semiconductor film will be described.

Figure 15A:
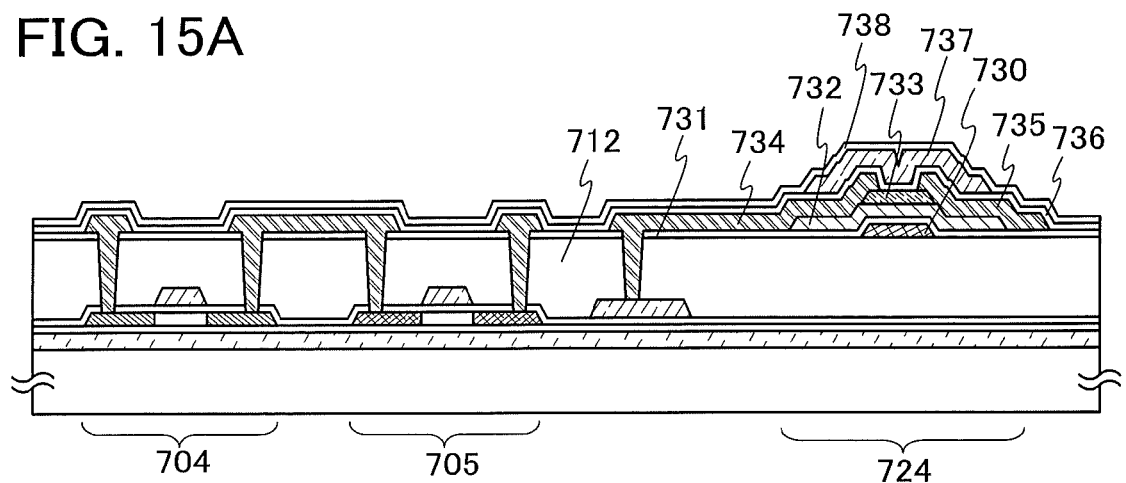
FIGS. 15A and 15B are diagrams each illustrating a structure of a transistor.

As in Embodiment 8, a semiconductor device illustrated in FIG. 15A includes an n-channel transistor 704 and a p-channel transistor 705 each of which includes crystalline silicon. In addition, a bottom-gate transistor 724 which has a channel-protective structure and includes an oxide semiconductor film is formed over the n-channel transistor 704 and the p-channel transistor 705 in FIG. 15A.

The transistor 724 includes a gate electrode 730 which is formed over the insulating film 712, a gate insulating film 731 which is over the gate electrode 730, an oxide semiconductor film 732 which overlaps with the gate electrode 730 and which is over the gate insulating film 731, a channel protective film 733 which overlaps with the gate electrode 730 and which is over the island-shaped oxide semiconductor film 732, an electrode 734 and an electrode 735 which are formed over the oxide semiconductor film 732, an insulating film 736 which is formed over the electrode 734, the electrode 735, and the channel protective film 733, and a back gate electrode 737 which overlaps with the oxide semiconductor film 732 and which is formed over the insulating film 736. Further, an insulating film 738 formed over the back gate electrode 737 may be included as a component of the transistor 724.

The channel protective film 733 can prevent the portion of the oxide semiconductor film 732 which serves as a channel formation region later, from being damaged in a later step (for example, reduction in thickness due to plasma or an etchant in etching). Thus, reliability of the transistor can be improved.

An inorganic material containing oxygen (silicon oxide, silicon nitride oxide, silicon oxynitride, aluminum oxide, aluminum oxynitride, or the like) can be used for the channel protective film 733. The channel protective film 733 can be formed by a vapor deposition method such as a plasma CVD method or a thermal CVD method, or a sputtering method. After the deposition of the channel protective film 733, the shape thereof is processed by etching.

An inorganic material containing oxygen is used for the channel protective film 733, whereby a structure can be provided, in which oxygen is supplied from the channel protective film 733 to the oxide semiconductor film 732 and oxygen deficiency serving as a donor is reduced to satisfy the stoichiometric composition even when the oxygen deficiency occurs in the oxide semiconductor film 732 by heat treatment for reducing moisture or hydrogen. Thus, the channel formation region can be made to be close to i-type and a variation in electric characteristics of the transistor 724 due to oxygen deficiency can be reduced; accordingly, the electric characteristics can be improved.

Figure 15B:
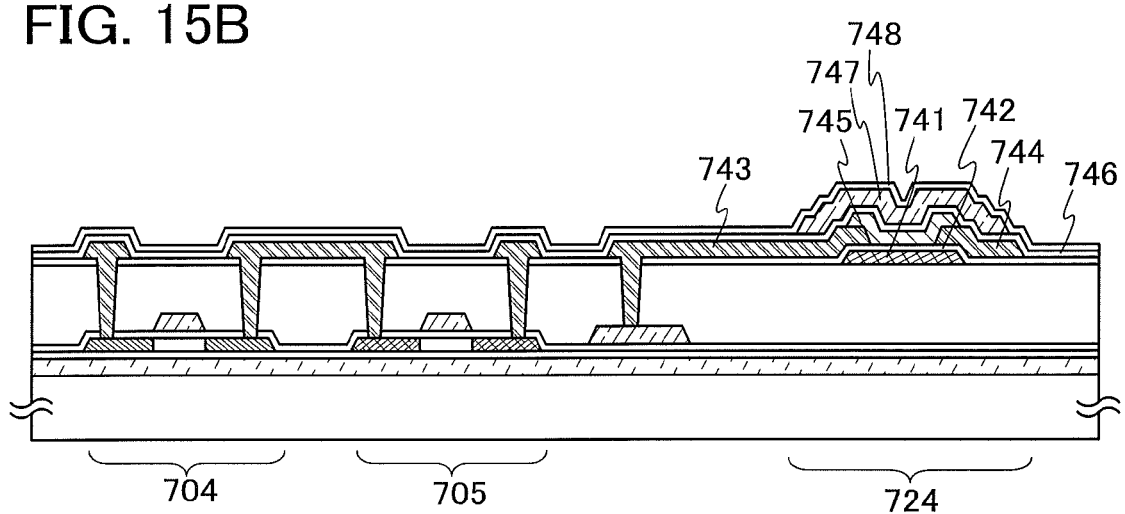

As in Embodiment 8, a semiconductor device illustrated in FIG. 15B includes the n-channel transistor 704 and the p-channel transistor 705 each of which includes crystalline silicon. In addition, a bottom-contact transistor 724 including an oxide semiconductor film is formed over the n-channel transistor 704 and the p-channel transistor 705 in FIG. 15B.

The transistor 724 includes a gate electrode 741 which is formed over the insulating film 712, a gate insulating film 742 which is over the gate electrode 741, an electrode 743 and an electrode 744 which are over the gate insulating film 742, an oxide semiconductor film 745 which overlaps with the gate electrode 741 with the gate insulating film 742 therebetween, an insulating film 746 which is formed over the oxide semiconductor film 745, and a back gate electrode 747 which overlaps with the oxide semiconductor film 745 and which is formed over the insulating film 746. Further, an insulating film 748 formed over the back gate electrode 747 may be included as a component of the transistor 724.

This embodiment can be implemented by being combined as appropriate with any of the embodiments.

Embodiment 10

In this embodiment, an example of how to calculate the off-state current of a transistor will be described.

Figure 16:
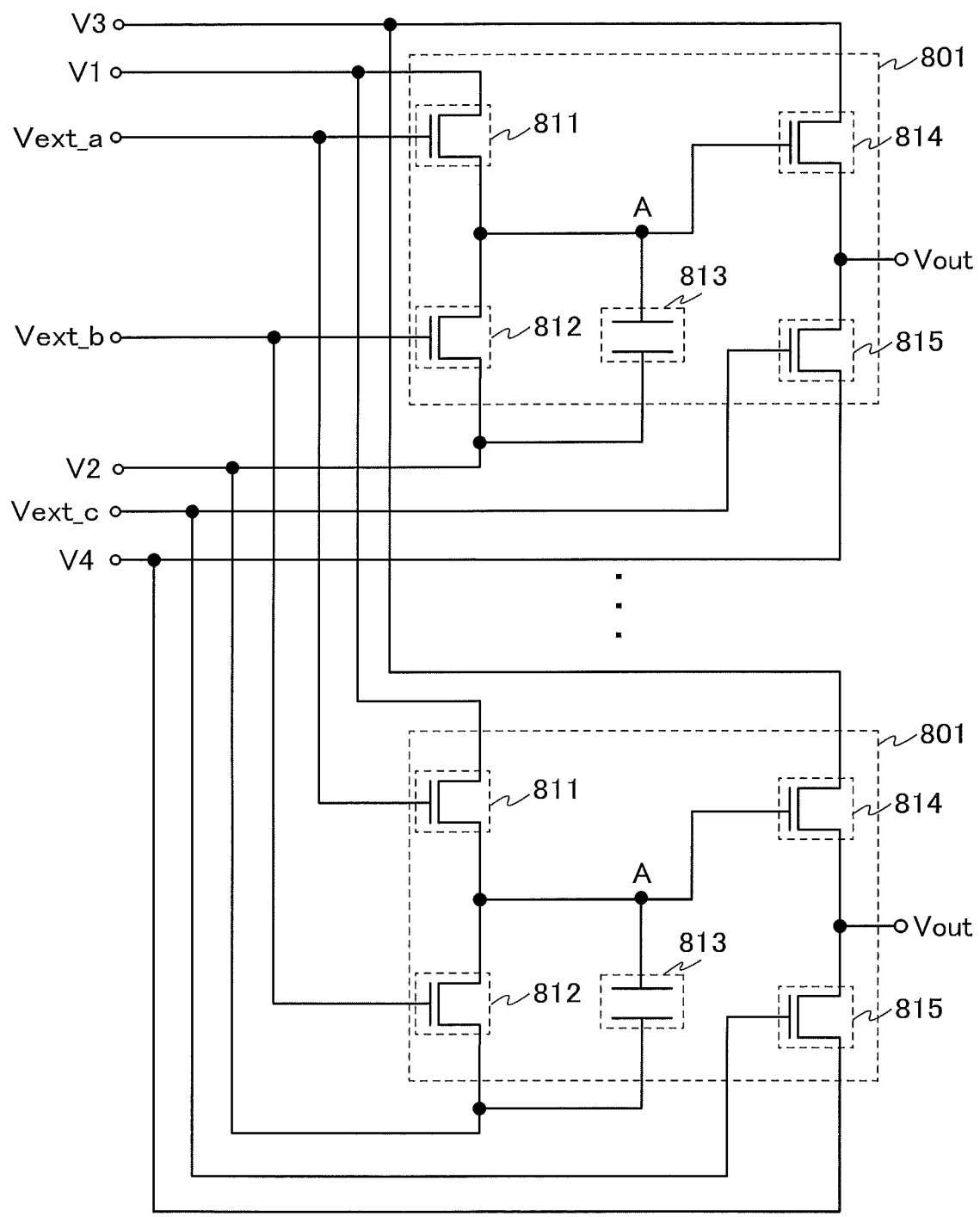
FIG. 16 is a circuit diagram of a characteristics evaluation circuit.

First, the structure of a test element group (TEG) which was used for calculating the off-state current is described with reference to FIG. 16. In this embodiment, a plurality of measurement systems 801 in which the circuits for evaluating characteristics are connected in parallel are provided. Specifically, FIG. 16 illustrates the test element group (TEG) in which eight measurement systems are connected in parallel (only two measurement systems are illustrated in FIG. 16).

The measurement system 801 includes a transistor 811, a transistor 812, a capacitor 813, a transistor 814, and a transistor 815.

The transistor 811 is a charge injection transistor. A first terminal of the transistor 811 is connected to a node to which a potential V1 is supplied, and a second terminal of the transistor 811 is connected to a first terminal of the transistor 812. A gate electrode of the transistor 811 is connected a node to which a potential Vext_a is supplied.

The transistor 812 is a leakage current evaluating transistor. Note that in this embodiment, leakage current also means the off-state current of a transistor. The first terminal of the transistor 812 is connected to the second terminal of the transistor 811. A second terminal of the transistor 812 is connected to a node to which the potential V2 is supplied. A gate electrode of the transistor 812 is connected to a node to which a potential Vext_b is supplied.

A first electrode of the capacitor 813 is connected to the second terminal of the transistor 811 and the first terminal of the transistor 812. A second electrode of the capacitor 813 is connected to the node to which the potential V2 is supplied.

A first terminal of the transistor 814 is connected to a node to which a potential V3 is supplied. A second terminal of the transistor 814 is connected to a first terminal of the transistor 815. A gate electrode of the transistor 814 is connected to the second terminal of the transistor 811, the first terminal of the transistor 812, and the first electrode of the capacitor 813. Note that a node to which the gate electrode of the transistor 814 is connected is denoted by the node A.

The first terminal of the transistor 815 is connected to the second terminal of the transistor 814. A second terminal of the transistor 815 is connected to a node to which a potential V4 is supplied. A gate electrode of the transistor 815 is connected to a node to which a potential Vext_c is supplied.

Further, the measurement system 801 outputs the potential of a node in which the second terminal of the transistor 814 and the first terminal of the transistor 815 are connected as a potential Vout of an output signal.

Furthermore, in this embodiment, a transistor in which an active layer includes an oxide semiconductor and the channel formation region included in the active layer has a channel length (L) of 10 μm and a channel width (W) of 10 μm was used as the transistor 811.

Note that a channel formation region corresponds to a region of a semiconductor film, which overlaps with a gate electrode with a gate insulating film provided between the semiconductor film and the gate electrode and does not overlap with a source electrode and a drain electrode.

Furthermore, a transistor in which an active layer includes an oxide semiconductor and the channel formation region included in the active layer has a channel length (L) of 3 μm and a channel width (W) of 100 μm was used as the transistor 814 and the transistor 815.

As the transistor 812, a bottom gate transistor which includes an oxide semiconductor in the active layer was used. In the transistor 812, a source electrode and a drain electrode are in contact with an upper part of the active layer, a region where the source and drain electrodes overlapping with a gate electrode is not provided, and an offset region with a width of 1 μm is provided. Providing the off set region can reduce parasitic capacitance. Further, as the transistor 812, a transistor in which the channel formation region included in the active layer was used. The active layer varies in size in accordance with Conditions 1 to 6 illustrated in Table 1 below.

TABLE 1

|  | Channel length (L) [μm] | Channel Width (W) [μm] |
| --- | --- | --- |
| Condition 1 | 1.5 | $1 \times 10^5$ |
| Condition 2 | 3 | $1 \times 10^5$ |

TABLE 1-continued

|  | Channel length (L) [μm] | Channel Width (W) [μm] |
| --- | --- | --- |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

Note that in the case where the charge injection transistor 811 is not provided in the measurement system 801, the leakage current evaluating transistor 812 needs to be turned on in charge injection to the capacitor 813. In this case, when the leakage current evaluating transistor 812 is an element which is slowly turned from the on-state into the steady off-state, the measurement would take a long time. When both a charge injection transistor 811 and the leakage current evaluating transistor 812 are provided in the measurement system 801 as illustrated in FIG. 16, the leakage current evaluating transistor 812 can be kept off in charge injection. Consequently, time required for measurement can be reduced.

In addition, both a charge injection transistor 811 and the leakage current evaluating transistor 812 are provided in the measurement system 801, so that each of these transistors can be of the proper size. Further, by making the channel width W of the transistor 812 for evaluating leakage current larger than that of the transistor 811 for injecting charge, the leakage current other than the leakage current of the evaluating leakage current transistor 812 can be made relatively small in the circuit for characteristic evaluation. As a result, the leakage current of the transistor 812 for evaluating leakage current can be measured with high accuracy. In addition, the transistor 812 for evaluating leakage current does not need to be turned on when charge is injected; therefore, influence of change in the potential of the node A caused by part of the charge in the channel formation region of the transistor 812 flowing into the node A is prevented.

On the other hand, by making the channel width W of the transistor 811 for injecting charge smaller than that of the transistor 812 for evaluating leakage current, the leakage current of the transistor 811 for injecting charge can be made relatively small. Further, change in the potential of the node A, due to flow of part of the charge in the channel formation region into the node A, has little influence at the time of injection of charge.

In addition, by connecting the measurement systems 801 in parallel as illustrated in FIG. 16, the leakage current of the circuit for characteristic evaluation can be calculated with a higher accuracy.

Next, a specific method for calculating the off-state current of a transistor with the use of the test element group (TEG) illustrated in FIG. 16 will be described.

Figure 17:
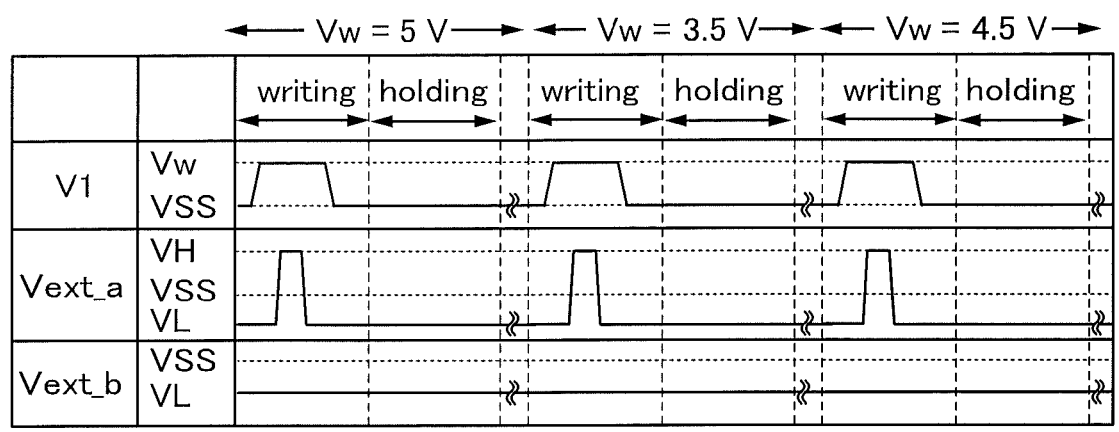
FIG. 17 is a timing diagram of the characteristics evaluation circuit.

First, a method for calculating the leakage current of the TEG illustrated in FIG. 16 is described with referent to FIG. 17. FIG. 17 is a timing diagram used to describe the method for calculating the leakage current of the TEG illustrated in FIG. 16.

In the method for calculating the leakage current with the use of the TEG illustrated in FIG. 16, a period is divided into a write period and a holding period. Operations performed in these periods will be described below. Note that in both of the writing period and the holding period, the potential V2 and the potential V4 was 0 V, the potential V3 was 5 V, and the potential Vext_c was 0.5 V.

First, in a write period, the potential Vext_b is set to a potential VL (−3 V) which leads the transistor 812 to be turned off. In addition, after the potential V1 is set to a writing potential Vw, the potential Vext_a is set to a potential VH (5 V) for a predetermined time, the level of which leads the transistor 811 to be turned on. Consequently, with the structure, charge is stored on the node A, so that the potential of the node A becomes equivalent to the writing potential Vw. Next, the potential Vext_a is set to the potential VL which leads the transistor 811 to be turned off. After that, the potential V1 is set to a potential VSS (0 V).

Then, in the holding period, an amount of change in the potential of the node A, due to change in an amount of the charge held in the node A, is measured. From the amount of variation in the potential, the value of the current flowing between the first terminal and the second terminal of the transistor 812 can be calculated. In such a manner, accumulation of charge in the node A and measurement of the amount of change in the potential of the node A can be performed.

In the measurement, charge is accumulated in the node A and the amount of variation in the potential of the node A is measured (this operation is also referred to as accumulation and measurement operation) repeatedly. Firstly, a first accumulation and measurement operation was repeated 15 times. In the first accumulation and measurement operation, the write potential Vw is 5 V in a write period, and held for an hour in a hold period. Secondly, a second accumulation and measurement operation were repeated twice. In the second accumulation and measurement operation, the write potential Vw is 3.5 V in a write period, and held for 50 hours in a hold period. Thirdly, a third accumulation and measurement operation was performed once. In the third accumulation and measurement operation, the write potential Vw is 4.5 V in a write period, and held for 10 hours in a hold period. It is possible to confirm if a measured current value is a value supposed to be obtained at the steady state by repeating the storage and measurement operations. In other words, it is possible to remove a transient (a current decreasing with time after the start of the measurement) from $I_A$ (current flowing through the node A). As a result, the leakage current can be measured with greater accuracy.

In general, $V_A$ denoting the potential of the node A can be measured as a function of the potential Vout of an output signal and expressed by the following equation.

$$V_A = F(Vout) \quad \text{[FORMULA 1]}$$

Electric charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the value of the capacitance of the capacitor 813 and the value of the capacitance other than that of the capacitor 813.

$$Q_A = C_A V_A + \text{const} \quad \text{[FORMULA 2]}$$

$I_A$ denoting current flowing through the node A is the time derivatives of charge flowing to the node A (or charge flowing from the node A), so that the current $I_A$ is expressed by the following equation.

$$I_A \equiv \frac{\Delta Q_A}{\Delta t} = \frac{C_A^* \Delta F(Vout)}{\Delta t} \quad \text{[FORMULA 3]}$$

For example, $\Delta t$ is approximately 54000 sec. $I_A$ (current flowing through the node A) can be determined from $C_A$ (the capacitance of the capacitor connected to the node A) and Vout (the potential of the output signal) in this manner, so that the leakage current of the test element group (TEG) can be determined.

Next, the results of measuring the potential Vout of the output signal by the measurement method using the above test element group (TEG) are illustrated, and the value of the leakage current of the test element group (TEG), which was calculated from the measurement results, is illustrated.

Figure 18:
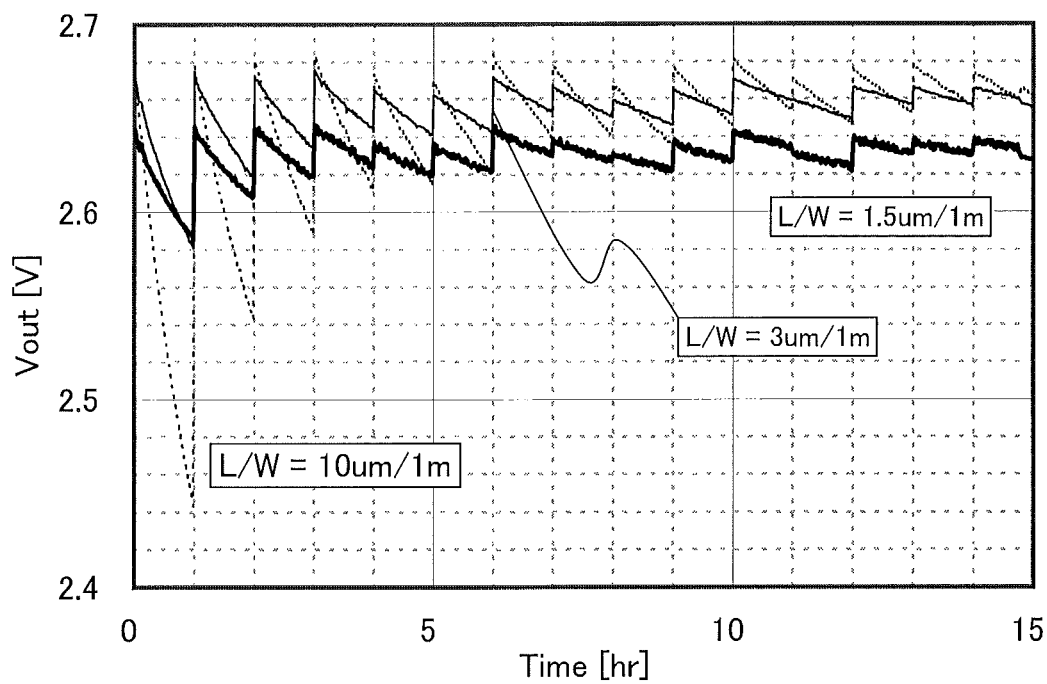
FIG. 18 is a graph illustrating a relation between elapsed time Time and a potential Vout of an output signal in the characteristics evaluation circuit.
Figure 19:
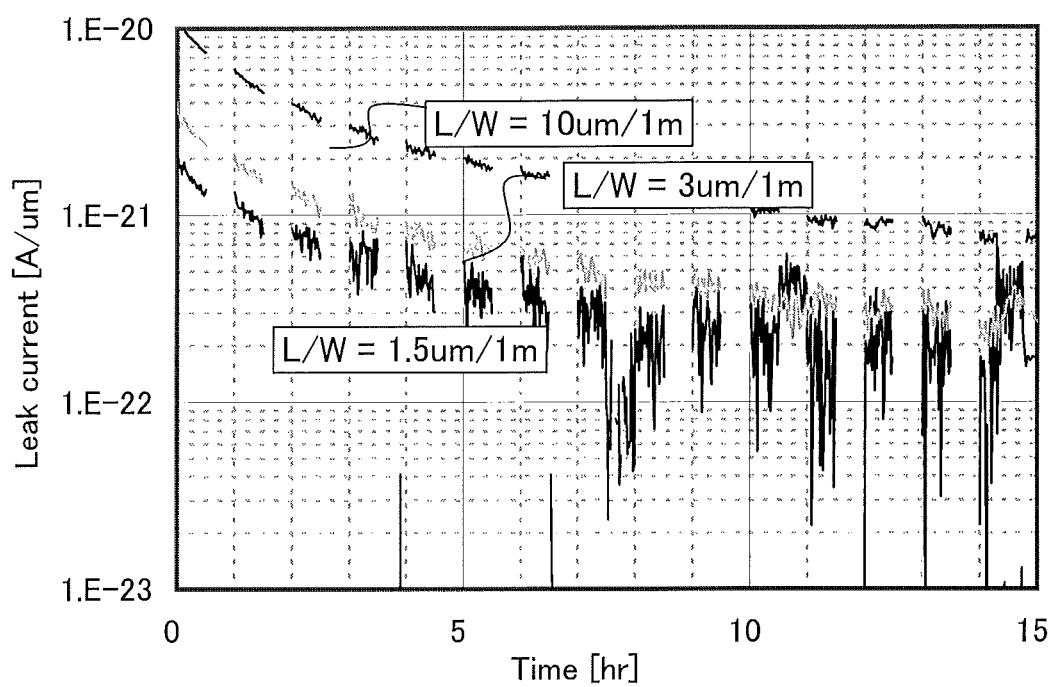
FIG. 19 is a graph illustrating a relation between elapsed time Time and leakage current measured in the characteristics evaluation circuit.

FIG. 18 illustrates, as an example, a relation between elapsed time Time and Vout (the potential of the output voltage) in the measurement (the first storage and measurement operation) under conditions 1 to 3. FIG. 19 illustrates a relation between the elapsed time Time and the leakage current calculated by the measurement in the measurement. It is found that the potential Vout of the output signal is fluctuated after start of the measurement and that it takes 10 hours or longer to be in a steady state.

Figure 20:
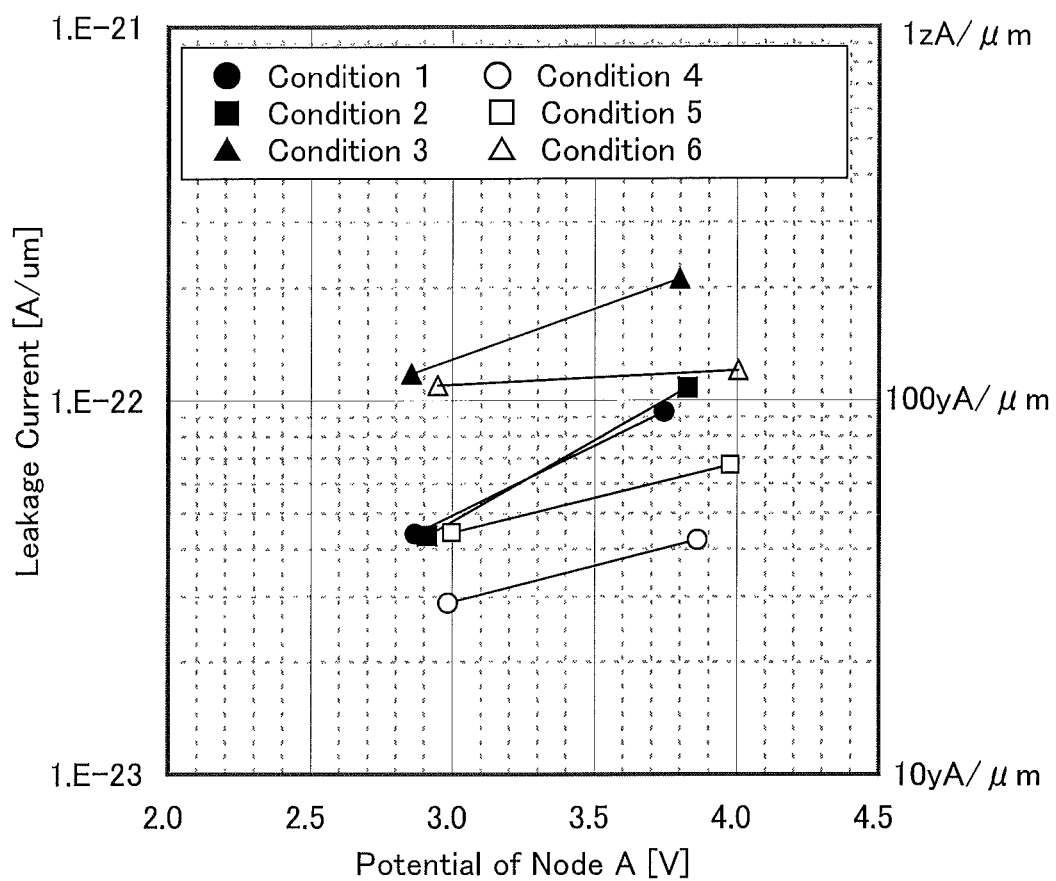
FIG. 20 is a graph illustrating a relation between a potential of a node A and leakage current in the characteristics evaluation circuit.

FIG. 20 illustrates a relation between the potential of the node A and the leakage current under conditions 1 to 6, which was estimated by the measurement. In FIG. 20, i under condition 4 for example, the leakage current is 28 yA/μm when the potential of the node A is 3.0 V. Since the off-state current of the transistor 812 is included in the leakage current, the off-state current of the transistor 812 can be also regarded as 28 yA/μm or lower.

As described above, the leakage current is sufficiently low in the test element group (TEG) having a transistor including a high-purity oxide semiconductor layer serving as a channel formation layer; therefore, it can be understood that the off-state current of the transistor is sufficiently low.

Example 1

A semiconductor device according to an embodiment of the present invention can realize an electronic device with low power consumption. In particular, in the case where a portable electronic device which has difficulty in continuously receiving power, an advantage in increasing the continuous duty period can be obtained when a semiconductor device with low power consumption according to an embodiment of the present invention is added as a component of the device.

The semiconductor device according to an embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 21A to 21D illustrate specific examples of these electronic devices.

Figure 21A:
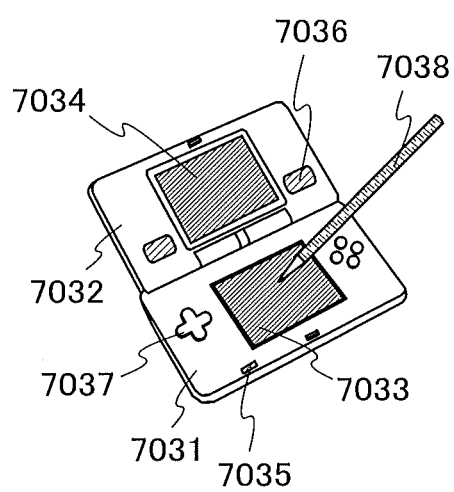
FIGS. 21A to 21D are diagrams each illustrating an electronic device.

FIG. 21A illustrates a portable game machine including a housing 7031, a housing 7032, a display portion 7033, a display portion 7034, a microphone 7035, speakers 7036, an operation key 7037, a stylus 7038, and the like. The semiconductor device according to an embodiment of the present invention can be used for an integrated circuit for controlling driving of the portable game machine. With the use of the semiconductor device according to an embodiment of the present invention for the integrated circuit for controlling driving of the portable game machine, a portable game machine with low power consumption can be provided. Although the portable game machine illustrated in FIG. 21A includes two display portions 7033 and 7034, the number of display portions included in the portable game machine is not limited to two.

Figure 21B:
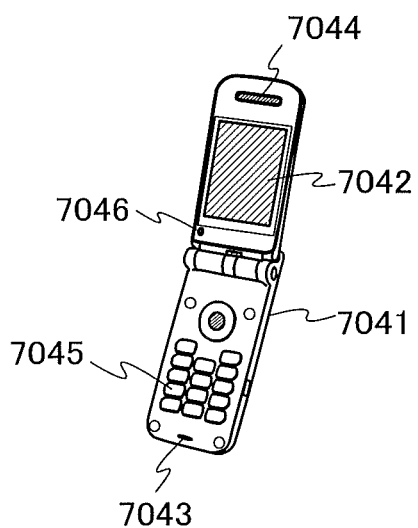

FIG. 21B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The semiconductor device according to an embodiment of the present invention can be used for an integrated circuit for controlling driving of the mobile phone. With the use of the semiconductor device according to an embodiment of the present invention for the integrated circuit for controlling driving of the mobile phone, a mobile phone with low power consumption can be provided.

Figure 21C:
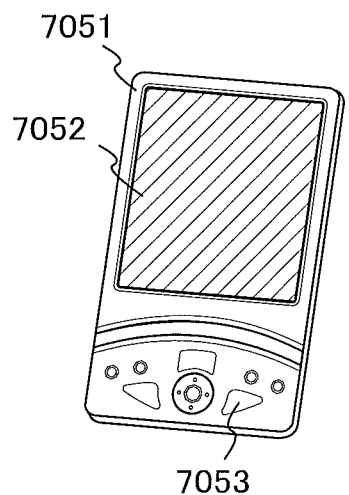

FIG. 21C illustrates a portable information terminal including a housing 7051, a display portion 7052, operation keys 7053, and the like. A modem may be incorporated in the housing 7051 of the portable information terminal illustrated in FIG. 21C. The semiconductor device according to an embodiment of the present invention can be used for an integrated circuit for controlling driving of the portable information terminal. With the use of the semiconductor device according to an embodiment of the present invention for the integrated circuit for controlling driving of the portable information terminal, a portable information terminal with low power consumption can be provided.

Figure 21D:
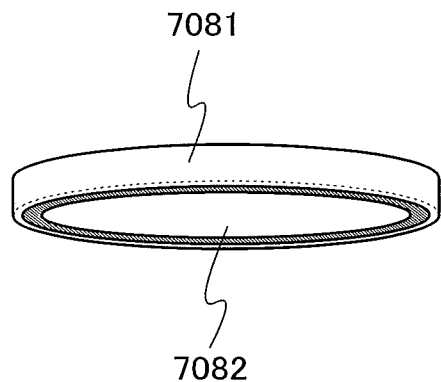

FIG. 21D is a lighting device including a housing 7081, a light source 7082, and the like. The light source 7082 includes a light-emitting element. The semiconductor device according to an embodiment of the present invention can be used for an integrated circuit for controlling driving of the light source 7082. With the use of the semiconductor device according to an embodiment of the present invention for the integrated circuit for controlling driving of the lighting device, a lighting device with low power consumption can be provided.

This embodiment can be implemented by being combined as appropriate with any of the embodiments.

EXPLANATION OF REFERENCE

100: DC-DC converter; 101: power conversion circuit; 102: transistor; 103: constant voltage generation portion; 104: output voltage control circuit; 105: back gate control circuit; 110: gate electrode; 111: insulating film; 112: semiconductor film; 113: source electrode; 114: drain electrode; 115: insulating film; 116: back gate electrode; 117: insulating film; 120: substrate; 130: diode; 131: coil; 132: capacitor; 133: transformer; 134: diode; 135: transformer; 200: resistor; 201: resistor; 202: error amplifier; 203: phase compensation circuit; 204: comparator; 205: triangle wave generator; 206: buffer; 210: current detection circuit; 211: CT sensor; 212: rectifier; 213: integrating circuit; 214: resistor; 215: capacitor; 216: power-voltage conversion circuit; 217: comparator; 218: transistor; 219: transistor; 220: inverter; 221: power source; 301: AC power source; 302: switch; 303: rectification circuit; 304: light-emitting element; 350: photodiode; 351: switch; 352: capacitor; 353: pulse width modulation circuit; 354: inverter; 355: band pass filter; 356: transistor; 357: transistor; 358: transistor; 359: transistor; 360: diode; 363: diode; 500: glass substrate; 501: insulating film; 502: back gate electrode; 503: insulating film; 504: semiconductor film; 505: source electrode; 506: drain electrode; 507: insulating film; 508: gate electrode; 510: region; 700: substrate; 701: insulating film; 702: semiconductor film; 703: semiconductor film; 704: n-channel transistor; 705: p-channel transistor; 706: gate electrode; 707: gate electrode; 708: insulating film; 711: wiring; 712: insulating film; 713: gate electrode; 714: gate insulating film; 715: an oxide semiconductor film; 716: electrode; 717: electrode; 718: electrode; 719: electrode; 720: electrode; 723: insulating film; 724: transistor; 725: back gate electrode; 726: insulating film; 730: gate electrode; 731: gate insulating film; 732: oxide semiconductor film; 733: channel protective film; 734: electrode; 735: electrode; 736: insulating film; 737: the back gate electrode; 738: insulating film; 741: gate electrode; 742: gate insulating film; 743: electrode; 744: electrode; 745: oxide semiconductor film; 746: insulating film; 747: the back gate electrode; 748: insulating film; 801: measurement system; 811: transistor; 812: transistor; 813: capacitor; 814: transistor; 815: transistor; 7031: housing; 7032: housing; 7033: display portion; 7034: display portion; 7035: microphone; 7036: speaker; 7037: operation key; 7038: stylus; 7041: housing; 7042: display portion; 7043: audio input portion; 7044: audio output portion; 7045: operation key; 7046: light-receiving portion; 7051: housing; 7052: display portion; 7053: operation key; 7081: housing; 7082: light source This application is based on Japanese Patent Application serial no. 2010-132529 filed with Japan Patent Office on Jun. 10, 2010, the entire contents of which are hereby incorporated by reference.

The invention claimed is:

1. A DC-DC converter comprising:
a power conversion circuit comprising:
a transistor, and
a constant-voltage generation circuit comprising:
a coil directly connected to one of a source and a drain of the transistor; and
a diode directly connected to the one of the source and the drain of the transistor,
wherein the transistor is configured to control a supply of current to the coil such that induced electromotive force is generated in the coil, and
wherein a threshold voltage of the transistor is controlled according to a magnitude of a power output from the constant-voltage generation circuit.

2. The DC-DC converter according to claim 1,
wherein the transistor comprises a gate electrode and a back gate electrode with a semiconductor film interposed therebetween, and
wherein the threshold voltage of the transistor is controlled by a potential applied to the back gate electrode.

3. The DC-DC converter according to claim 1,
wherein the threshold voltage is shifted in a negative direction when the power output from the constant-voltage generation circuit exceeds a predetermined value, and
wherein the threshold voltage is shifted in a positive direction when the power output from the constant-voltage generation circuit is equal to or smaller than the predetermined value.

4. The DC-DC converter according to claim 2, further comprising a back gate control circuit,
wherein the potential applied to the back gate electrode is controlled by the back gate control circuit.

5. The DC-DC converter according to claim 2, wherein the semiconductor film has a band gap larger than silicon.

6. The DC-DC converter according to claim 2, wherein the semiconductor film comprises an oxide semiconductor.

7. A semiconductor device comprising the DC-DC converter according to claim 1.

8. A DC-DC converter comprising:
a constant-voltage generation circuit comprising a coil and a diode;
a transistor electrically connected to the constant-voltage generation circuit, the transistor comprising a gate electrode and a back gate electrode with a semiconductor film interposed therebetween;
an output voltage control circuit which is configured to control a ratio of an ON time to OFF time of the transistor; and
a back gate control circuit configured to control a potential applied to the back gate electrode,
wherein the transistor is configured to control a supply of current to the coil such that induced electromotive force is generated in the coil,
wherein one of a source and a drain of the transistor is directly connected to the coil and the diode, and
wherein the back gate control circuit comprises:
a current detection circuit for detecting an amount of current output from the constant-voltage generation circuit; and
a power-voltage conversion circuit for determining the potential applied to the back gate electrode from the amount of the current output from the constant-voltage generation circuit and an output voltage from the constant-voltage generation circuit.

9. The DC-DC converter according to claim 8,
wherein the current detection circuit comprises:
a current trans sensor;
a rectifier electrically connected to the current trans sensor; and
an integrating circuit connected to the rectifier.

10. The DC-DC converter according to claim 9, wherein the current trans sensor is configured to generate current corresponding to the amount of the current output from the constant-voltage generation circuit.

11. The DC-DC converter according to claim 9,
wherein the rectifier is configured to rectify the current generated by the current trans sensor, and
wherein the integrating circuit is configured to convert the rectified current to form a voltage which is output to the power-voltage conversion circuit for determining the potential applied to the back gate electrode.

12. The DC-DC converter according to claim 9, wherein the integrating circuit comprises a resistor and a capacitor which are connected in parallel.

13. The DC-DC converter according to claim 8, wherein the semiconductor film has a band gap larger than silicon.

14. The DC-DC converter according to claim 8, wherein the semiconductor film comprises an oxide semiconductor.

15. A semiconductor device comprising the DC-DC converter according to claim 8.

16. A DC-DC converter comprising:
a constant-voltage generation circuit comprising a coil and a diode;
a transistor electrically connected to the constant-voltage generation circuit, the transistor comprising a gate electrode and a back gate electrode with a semiconductor film interposed therebetween;
an output voltage control circuit which is configured to control a ratio of an ON time to OFF time of the transistor; and
a back gate control circuit configured to control a potential applied to the back gate electrode,
wherein the transistor is configured to control a supply of current to the coil such that induced electromotive force is generated in the coil,
wherein one of a source and a drain of the transistor is directly connected to the coil and the diode, and
wherein the back gate control circuit comprises:
a current detection circuit for detecting an amount of current output from the constant-voltage generation circuit and converting the current into a voltage; and
a power-voltage conversion circuit for determining the potential applied to the back gate electrode from the amount of the current output from the constant-voltage generation circuit and an output voltage from the constant-voltage generation circuit.

17. The DC-DC converter according to claim 16,
wherein the power-voltage conversion circuit comprises:
a comparator;
an inverter;
a power source; and
a second transistor and a third transistor.

18. The DC-DC converter according to claim 17,
wherein the second transistor comprises a gate electrode electrically connected to the comparator, a first electrode electrically connected to the back gate electrode of the transistor, and a second electrode electrically connected to the power source, and
wherein the third transistor comprises a gate electrode electrically connected to the inverter, a first electrode electrically connected to the back gate electrode of the transistor, and a second electrode.

19. The DC-DC converter according to claim 17,
wherein the comparator is configured to be input with the voltage output from the current detection circuit and a reference voltage,
wherein the comparator is configured to generate a high level voltage when the voltage is larger than the reference voltage, and
wherein the comparator is further configured to generate a low level voltage when the voltage is equal to or smaller than the reference voltage.

20. The DC-DC converter according to claim 19, wherein the comparator is configured to input one of the high level voltage and the low level voltage to the gate electrode of the third transistor through the inverter.

21. The DC-DC converter according to claim 19, wherein the comparator is configured to input one of the high level voltage and the low level voltage to the gate electrode of the second transistor.

22. A semiconductor device comprising the DC-DC converter according to claim 16.

* * * * *

UNITED STATES PATENT AND TRADEMARK OFFICE
CERTIFICATE OF CORRECTION

| | |
|---|---|
| PATENT NO. | : 8,710,762 B2 |
| APPLICATION NO. | : 13/154827 |
| DATED | : April 29, 2014 |
| INVENTOR(S) | : Kei Takahashi, Jun Koyama and Masato Ishii |

It is certified that error appears in the above-identified patent and that said Letters Patent is hereby corrected as shown below:

In the Specification

Column 14, line 44 – replace "Wont" with --Wout--;

Column 22, line 44 – replace "mm" with --nm--;

Column 25, line 50 – replace "clyopump" with --cryopump--;

Column 25, lines 53-54 – replace "clyopump" with --cryopump--; and

In the Claims

Column 38, line 34, claim 1 – after "transistor" replace "," with --;--.

Signed and Sealed this
Ninth Day of June, 2015

Michelle K. Lee
*Director of the United States Patent and Trademark Office*